United States Patent [19]

Norton et al.

[11] Patent Number: 5,256,260

[45] Date of Patent: Oct. 26, 1993

[54] METHOD AND APPARATUS FOR THE ELECTRODEPOSITION OF BISMUTH BASED MATERIALS AND SUPERCONDUCTORS

[75] Inventors: Michael L. Norton, Huntington, W. Va.; Horng-Yi Tang, Feng-Yuan, Taiwan

[73] Assignee: University of Georgia Research Foundation, Athens, Ga.

[21] Appl. No.: 745,925

[22] Filed: Aug. 16, 1991

[51] Int. Cl.$^5$ ............................................. C25C 3/02
[52] U.S. Cl. ........................................ 204/71; 204/61; 509/729; 509/737; 509/784
[58] Field of Search ...................... 204/61, 71; 505/729, 505/737, 784

[56] References Cited

U.S. PATENT DOCUMENTS 3,498,894  3/1970  Cuomo et al. .......................... 204/61
4,870,051  9/1989  Maxfield et al. ....................... 204/71

OTHER PUBLICATIONS

Wignscouh, I. P. et al, "Oxygen Atom Thermal Vibration Anisotrophy in $Ba_{0.87}K_{0.13}BiO_3$" Appl. Phys Lett. vol. 53(18) Oct. 31, 1988 pp. 1753-1755.

Primary Examiner—John Niebling
Assistant Examiner—Brian M. Bolam
Attorney, Agent, or Firm—Deveau, Colton & Marquis

[57] ABSTRACT

The electrodeposition of bismuth based materials and superconductors is achieved under isothermal, constant potential conditions using a three electrode, one compartment cell geometry operating at temperature below about 450° C.

12 Claims, 22 Drawing Sheets

METHOD AND APPARATUS FOR THE ELECTRODEPOSITION OF BISMUTH BASED MATERIALS AND SUPERCONDUCTORS

This invention was made with government support under Grant/Contract No. CHE8600224 awarded by the National Science Foundation. The government has certain rights in the invention.

BACKGROUND OF THE INVENTION

1. Field of the Invention

This invention relates generally to the electrodeposition of superconductor compounds and more specifically to the electrodeposition of bismuthates in solution using a constant potentiostatic method and apparatus.

2. Prior Art

Since the discovery of warm superconductivity in the Ba-K-Bi-O system, it has been apparent that chemical approaches to the synthesis of this material must consider its thermal instability. This instability includes phase stability, potassium oxide volatility and the instability of the bismuth oxidation state at high temperatures. Although these problems appear to have been overcome for practical powder synthesis, the low temperature oxidation step usually employed may introduce artifacts into the structure of single crystalline samples, which may in turn make it more difficult to arrive at a theoretical understanding of these superconductors, and to use these superconductors for practical applications.

A maximum oxidation temperature of 450° C. has been suggested by Hinks et al., Synthesis, Structure, and Superconductivity in the $Ba_{1-x}K_xBiO_{3-4}$ System, 333 Nature 836 (1986), based upon thermogravimetric analyses. Progress has been made toward low temperature synthesis of materials in this system using KOH as a flux. The minimum initial growth temperature in these experiments was 360° C. These experiments are usually of long duration (50 hours). This technique, although producing quite useful crystals, is necessarily slow since it depends upon the air (or atmospheric) oxidation of the electroactive element (Bismuth (III)), which will occur at all locations on the melt surface (the ambient/liquid interface). Such slow processes may yield crystals displaying compositional variations reflecting temporal variations in the temperature, concentration and mass transport properties of these high viscosity, molten salts. In fact, a large mosaic spread has been reported for certain of the crystals produced. A crystal grown utilizing a faster growth technique would be expected to display these variations to a lesser extent. Additionally, the corrosive action of these melts may introduce impurities into the system through interaction with the container material.

In Norton, M.L., Electrodeposition of $Ba_{.6}K_{.4}BiO_3$, 24 Mat. Res. Bull. 1391–1397 (1989), deposition control via the use of a reference electrode was not necessary, since constant current gave apparently good results. More detailed analysis shows that the material provided by the potentiostatic method, that is, utilizing constant potential control via use of a novel reference (third) electrode such as Bi metal in contact with Bi ions in solution, is far superior. While the constant current method maintains a constant deposition rate, it does not keep growth per unit of surface area constant. The potentiostatic method does provide constant chemistry, whereas the former method does not. One skilled in the art of electrodeposition would prefer to use constant current, a less complex system than that described herein.

In Maxfield et al., U.S. Patent No. 4,870,051, a method for electrodepositing a mixture of metals suitable for oxidation to form superconducting ceramics is disclosed. This technique does not produce superconductors directly, and gives the indication that the individual elements must be deposited one at a time to make a complex superconductor. Although it is indicated in the '051 patent that there is potential control, the potentials mentioned do not have chemical meaning, and are not determined in a manner which makes sense of the potentials used in that since the elements are deposited seperately in this technique, the potential used has no direct effect upon the nature of the deposit formed. This is in strong contrast to the method described herein.

In Cuomo et al., U.S. Patent No. 3,498,894, a technique is presented for the synthesis and epitaxial growth of compound semiconductors by fused salt electrolysis. The Cuomo apparatus displays a two electrode cell, without a reference elecrode. Further, two materials are electrochemically active in Cuomo (only one is electroactive at a time in the Maxfield technique), and the potential is set to make the rates of both reactions become equal. In the present invention, materials are produced which will not necessarily have integer ratios of the components. Four different elements are deposited simultaneously, even though only one, Bi, is considered to be electrochemcially active at the potentials used. The three electrode system sets the polymerization rate at a constant value which coincides with the arrival and sticking of relative numbers of Ba and K ions on the surface, followed by incorporation into the bulk by further polymerization. Without this constant polymerization rate, the material will have varying composition as a function of time at growth coordinate. Constant current does not keep the polymerization rate constant, thus the materials formed are graduated, or inhomogeneous. The reason for the potential set herein is intrinsically different from the reason for the potential set in Cuomo.

Few materials with four elements, such as barium, potassium, bismuth and oxygen, have ever been electrodeposited. Since barium, potassium and oxygen are not electroactive in this situation, the change in the bismuth oxidation state can be used to drive crystal growth. Additionally, the use of potassium hydroxide or rubidium hydroxide as an electrochemical solvent is uncommon, and the combination of molten hydroxide chemistry coupled with bismuth is even more uncommon. The closest technology to the present invention is the preparation of small, randomly located crystals in a slowly cooling solution. However, unlike the prior art, the present invention leads to the deposition of bismuth on conducting charged electrodes.

The goal of the crystal growth of nonstoichiometric materials such as those in the present system is to produce large single crystalline deposits or regions of uniform chemical potential, preferrably of any practical nominal composition. Since chemical potential (metal oxidation state) in this system is determined by stoichiometry, an isothermal (chemical potential is normally a function of temperature) technique of electrocrystallization should achieve this goal. In this invention, the preparation of $Ba_{.6}K_{.4}BiO_3$ is used as an example for the demonstration of a novel electrochemical synthetic technique for producing oxidized pseudo-binary oxide materials.

SUMMARY OF THE INVENTION

A novel, isothermal, low temperature molten salt electrochemical technique has been used for the preparation of $Ba_{.6}K_{.4}BiO_3$ by deposition and rapid crystallization. The resulting crystalline material has been characterized by X-Ray diffraction, scanning electron microscopy and by energy dispersive X-ray analysis. This electrochemical technique offers the distinct advantage of electronic control of product stoichiometry through potentiostatic control of chemical potential. Additionally, the temperatures employed are below those necessitating oxygen annealing. Because this technique can, in principal, provide less disordered samples of a variety of compositions, efforts to observe sublattice ordering of Ba and K, and even the potential for observation of the developement of anisotropy due to this ordering phenomena may be possible. Because of the difference in electron densities of Ba and K, such ordering may be more readily observed in this system than in the related Ba-Pb-Bi-O system.

The method for the electrodeposition of Bismuth based materials and superconductors is performed in a three-electrode, one compartment cell. In the preferred embodiment, a platinum, gold, or silver anode and a platinum cathode are contained within the cell. A single crystalline or polycrystalline Bismuth metal reference electrode also is placed in the cell, in close proximity to the anode. A quantity of potassium hydroxide is melted and specific quantities of $Ba(OH)_2$ or $Ba(OH)_2.8H_2O$ and $Bi_2O_3$ are added to the melt. The electrodes are placed within the melt and the entire system is kept at a temperature to sustain the melt. Electrolysis of the melt is begun at an applied potential typically between 0.6 and 0.9 V versus the Bismuth reference electrode. Deposition of the oxide crystals begins immediately on the anode. Deposition can be terminated by withdrawing the crystal laden anode from the melt at any time. The crystals or deposits can then be cleaned.

The relatively low temperature at which the electrodeposition of the present invention takes place coupled with the potentiostatic control of the chemical potential results in highly faceted product crystals. Unusually large crystals with [100] facets were produced. Additionally, the absence of dendritic or branched [111] directed growth on these crystals indicates that the crystal growth has been accomplished at conditions close to equilibrium. The crystals display the approximate $Ba_{.6}K_{.4}BiO_3$ stoichiometry, indicating the well-known superconducting compositions, which was substantiated through the use of SEM/EDX and X-ray diffraction studies. Magnetization data show a $T_c$ near 32K.

The products resulting from this invention include thin films and superconducting materials for electronic, microelectronic and research uses. The superconducting materials can be used as connectors, which can carry more current and signals at higher frequencies than normal metal connection lines. Because this process is achieved at low (less than about 350° c.) temperatures, it is thermally compatible with microelectronic devices. The products resulting from this invention also are of a relatively higher quality than known superconducting materials and are suitable for superconducting transistors or Josephson Junctions, which require higher quality materials. Pargellis, A. N. et al., 58(1) Appl. Phys. Let. 95 (1991).

Further, the operating temperature of the materials resulting from this invention are at least ten degrees higher than all but one of the alloy systems. The three dimensionality of the materials make them more amenable to microelectronics applications. Additionally, the materials produced from this process can be used as substrates for the growth of other lattice matching materials.

Accordingly, it is an object of the present invention to provide a technique for the low temperature, isothermal, isopotential electrochemical deposition of superconducting, highly crystalline materials in the Ba-K-Bi-O ("BKBO") systems.

It is another object of the present invention to provide a method of producing large, well-faceted crystals in the Ba-K-Bi-O system.

Yet another object of the present invention is to provide a method and apparatus for the production of Bismuth based materials and superconductors using molten salt electrocrystallization.

Still another object of the present invention is to provide a method and apparatus applying low temerpature, isothermal, isopotential electrocrystallization to a three electrode technique.

A still further object of the present invention is to provide a fast, isopotential method which is operative at temperatures below the oxidative instability temperature which results in the preparation of large, homogeneous, single crystalline samples.

An object of the present invention is to provide methods as above which are applicable to Rubidium systems such as the Ba-Rb-Bi-O ("BRBO") and Ba-K-Rb-Bi-O ("BKRBO") systems.

Another object of the present invention is to provide a method and apparatus for the production of Bismuth based materials and superconductors which is more efficient in process and costs then the currently known systems.

These objects and other objects, features, and advantages of the present invention will become apparent to one skilled in the art when the following Specification is read in conjunction with the attached Figures.

DETAILED DESCRIPTION OF A PREFERRED EMBODIMENT

1. Theory

Figure 1:
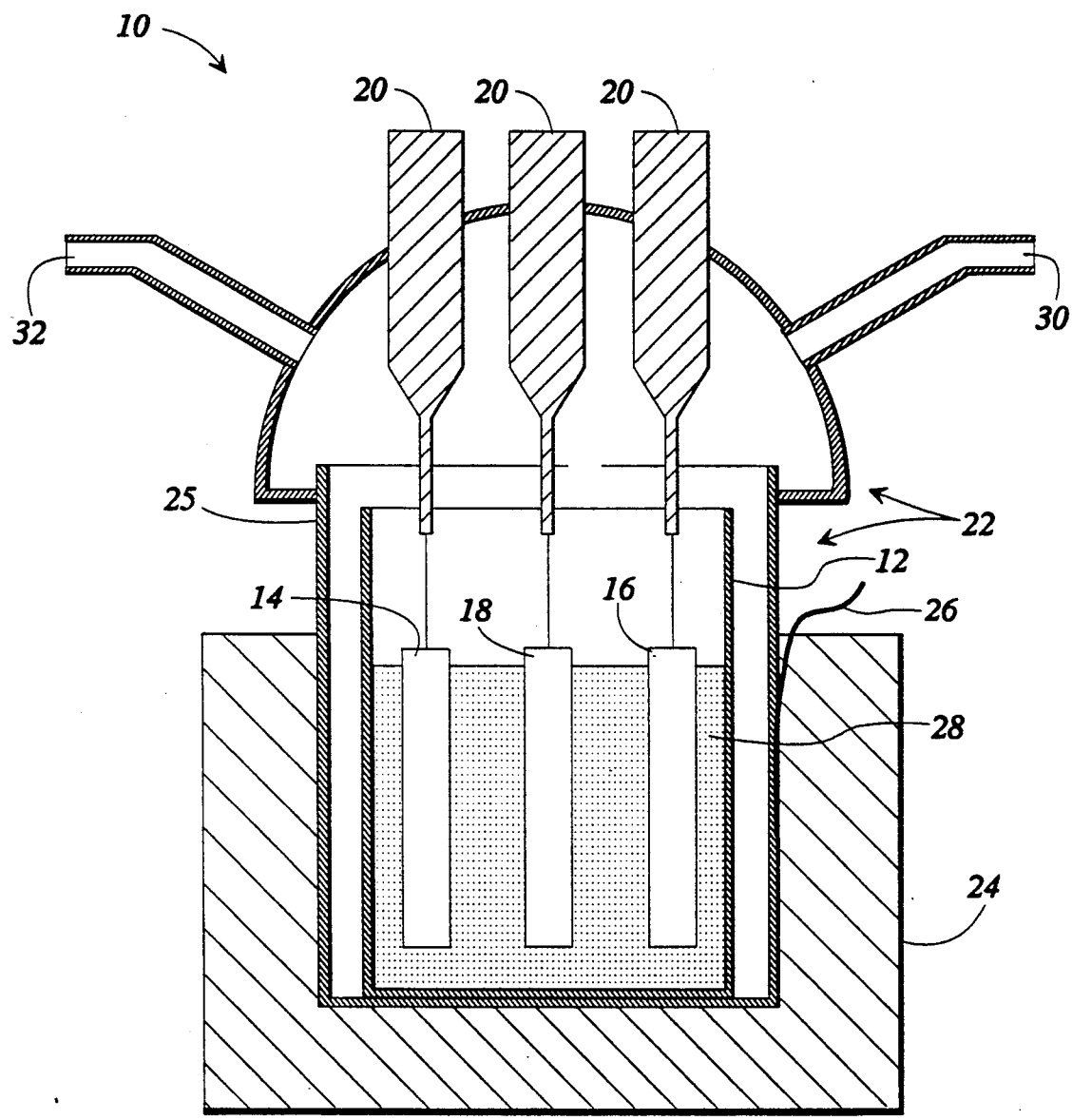
FIG. 1 is a schematic cross-section of the apparatus suitable for carrying out the method of the present invention.

The present invention is a technique for the low temperature (below about 350° C.), isothermal, isopotential electrochemical deposition of superconducting, highly crystalline materials in the Ba-K-Bi-O system, along with an apparatus for accomplishing this technique. This technique also is unique in that although it allows the electrodeposition to occur at low temperatures, it also is useable at temperatures above about 350° C. The relatively large (generally about 5 mm diameter), well facetted crystals produced have been chemically and physically characterized using SEM, EDX, PXRD, and magnetic methods, indicating that the crystals display the approximate stoichiometry of the well-known superconducting composition $Ba_{.6}K_{.4}BiO_3$.

The Bismuth based system of oxide superconductors (Ba-M-Bi-O, where M is any metal) is important as it's study may provide information giving rise to the long sought after room temperature superconductor. This conclusion is supported by two approaches. First, the electron-phonon interaction is so strong in $BaBiO_3$ that the frozen phonon mode or commensurate charge density wave is stable to 800K. The Tc of a system or material may be considered to have as its upper limit the temperature of this phase transition. A second approach, which is less qualitative, utilizes the relationship between average electronegativity and Tc and predicts that the Tc of the hypothetical compound $Ba_{1.6}Rb_{.4}BiO_4$ of this system should approach 276K. Few other systems currently display the high probability of future rises in Tc that this system displays.

It is important to recognize that the Ba-K-Bi-O system displays several modes of instability. First, at high temperatures, the potassium oxide component is volatile under standard oxide ceramic synthesis conditions; at intermediate temperatures, the potassium becomes insoluble in the pervoskite phase; and even at lower temperatures, the oxygen content becomes unstable. Second, Barium apparently can substitute for a large percentage of the Bismuth, at least in the parent compounds. Third, high Tc materials are intrinsically unstable, and are difficult to synthesize, and often have to be tricked (i.e. are metastable) into existence. The best known high Tc superconductor, $YBa_2Cu_3O_7$, is an example of this approach. The oxygen stoichiometry of this copper based material is thermally unstable, reflecting the lack of normal filling in the valence band, or its occupation by holes. A structurally identical material, $YBa_2Cu_3O_{6.5}$, is thermally stable, and is readily converted into fully oxidized $YBa_2Cu_3O_7$ via oxidation at reduced temperatures. All high Tc systems may not be as amenable to high temperature crystal growth, and low temperature approaches to crystallization of new materials must be developed. The utilization of low temperature synthetic techniques allows for the exploration of new regions of the phase diagram of chemical systems, and allows for the discovery of materials not accessible via high temperature techniques due to the presence of large activation energies intrinsic to massively reconstructive phase transformations.

The present invention utilizes a molten salt electrocrystallization method which has a number of potential advantages in the synthesis of novel conducting materials. First, it appears to be particularly well-suited to the Ba-K-Bi-O system. Second, conducting phases are preferentially synthesized in electrocrystallization because electrochemical potential losses (IR drop) are minimal in such phases. Third, growth of non-conductors is self-limited by a process commonly referred to as electrode passivation. Fourth, there is nearly instantaneous nucleation of the desired phase under proper conditions. Fifth, because nucleation and growth occurs only on the selected electrode area, there are only a limited number of nucleation sites, leading to a reduced number of nucleated crystals, in comparison to many crystallization techniques. Sixth, the relative supersaturation can be set electronically (potentiastatically), and the reaction can be stopped or quenched quickly. Seventh, all of the crystalline product can be readily and quickly extracted from the growth solution.

The anodic electrocrystallization technique is exceptionally well-suited for the preparation of large single crystals in the Ba-K-Bi-O system for at least two reasons. First, a successful flux or solution based growth technique requires significant solubility of the reagents to enable diffusion to provide significant mass transport. The product phases $(Ba_{1-x}K_xBiO_3)$(BKBO) generally are not very soluble in KOH, and therefore would cause recrystallization of BKBO to be a slow crystal growth process in this system. However, $Ba(OH)_2$ and $Bi_2O_3$ are relatively soluble in KOH. The electrochemical oxidation of Bi from an average formal $+3$ to a $>+4$ oxidation state yields an insoluble product which grows on the substrate. The large change in solubility accompanying the rather large change in average formal Bi oxidation state may be understood in terms of the associated change in Madelung energy.

Second, the intrinsic necessity of oxygen or oxidizing agent transport to the growing crystal/solution interface is delivered electrically in the present system, but chemical oxidation requires diffusion of oxygen across the ambient gas/condensed phase interface. This latter process generally results in formation of a solid polycrystalline surface barrier film of the oxidized product phase, which impedes further oxygen transport. In the electrochemical system, oxidative powder is delivered only to the desired crystal/solution interface. The fast, isopotential method operative at temperatures below the oxidative instability temperature of the present invention affords a superior route to preparation of the large, homogeneous, single crystalline samples required for the investigation of this anomolous, high Tc system.

2. Experimental a. Apparatus:

Referring now to FIG. 1, the apparatus 10 of the present invention in a preferred embodiment is shown. The low temperature ($T<350°$ C. and preferably $T<260°$ C.) electrodeposition is performed in a crucible 12. Although Teflon (TFE, tetra-fluoroethylene; Cole-Parmer) is the preferable container material as it does not contaminate the melt with long term contact, other noncontaminating materials are suitable for use as the crucible 12. For example, for experiments run at higher temperatures ($T>260°$ C.), alumina crucibles surrounded by sand baths can be used. Other suitable crucible materials include but are not limited to graphite, nickel, gold and silver. Deposition experiments have been performed at a variety of temperatures from 50° C. to over 400° C., with from 150° C. to 350° C. being the preferred range. The crucible 12 size is selected depending upon the amount of material to be electrodeposited.

Potentiostatic deposition is performed utilizing a three electrode, one compartment electrodeposition cell geometry. A high current synthetic potentiostat system is employed, such as Bioanalytical Systems, SP-2. The cell includes the crucible 12 containing a molten salt melt 28, more fully described below, with three electrodes 14, 16, 18 inserted into the melt 28. The entire crucible 12 containing the melt 28 and the electrodes 14, 16, 18 is contained within an electrodeposition cell 22, preferably quartz, which helps maintain a constant atmosphere over the melt and may contain a constant temperature bath. The cell 22 in turn is maintained at isothermal conditions, such as, for example, being contained within a thermal ballast cup 24, so as to keep the temperature of the apparatus 10 constant, that is to maintain isothermal conditions. Any arrangement which maintains isothermal conditions is suitable for this invention, such as but not limited to baths, sand baths, ballast cups and any other means suitable for heating and then maintaining an isothermal condition.

The three electrodes 14, 16, 18 include an anode working electrode 14, a cathode counter electrode 16, and a reference electrode 18. The three electrodes 14, 16, 18 are suspended within the melt 28 by any known conventional means such as electrode holders 20. The anode 14 and cathode 16 are suspended generally in the typical electrodeposition fashion opposite each other in the crucible 12. In the crucible 12, reference electrode 18 generally is suspended somewhat closer to anode 14 than to cathode 16. The preferred material for the working electrode 14 (positive, or biased anodically) is platinum, gold, or silver, although other metals can be used. A 1 mm diameter silver wire electrode (Aesar, 99.9%) is preferred for crystal growth. The film deposited during the electrodeposition process protects this electrode 14 from anodic dissolution. The preferred counter electrode 16 (negative or biased cathodically) used is a 1 mm diameter platinum wire (Aesar, 99.99%), which is coated rapidly with a thick polycrystalline layer of bismuth metal during use. Thus, a variety of materials is suitable for use as the counter electrode. The reference electrode 18, which is placed in close proximity to the working electrode 14 consists of a polycrystalline Bismuth metal (Johnson Matthey, 99.5%) rod, cast to a diameter of 1 mm. The reference electrode's 18 potential is related to the $pO_2$, $pH_2O$, and to the Bismuth salt concentration in the solution. This electrode system does not introduce impurities detectable by energy dispersive X-ray analysis (EDX) into the product phase. In the experimentaion and development of the present invention, the inventors have determined that the size and shape of the electrodes, and the depth the electrodes are inserted into the melt are not variables upon which the present invention depends, but may be chosen to be any dimension consistent with the size of the apparatus.

The combination of the crucible 12 containing the melt 28, the electrode holders 20 and suspended electrodes 14, 16, 18 is referred to generally as the electrodeposition cell. The cell 22 includes a cell cap 23 and a cell base 25. Cell base 25 generally rests in a large heat capacity thermal ballast, such as ballast cup 24, such that when crucible 12 is inserted within cell base 25, crucible 12 and melt 28 will remain at a constant temperature. Cell cap 23 covers the top of cell base 25 so as to maintain a relatively independent atmosphere within the cell 22 and to control or limit contact between the ambient atmosphere and the atmosphere within cell 22.

Electrode holders 20 are inserted through or embedded in the cell cap 23 in a generally vertical fashion such that electrodes 14, 16, 18 can be suspended from electrode holders 20 into the melt 28. The preferred distance between the reference electrode and the anode is 1 cm or less. Cell cap 23 also includes a cover gas inlet 30 and a cover gas outlet 32 through which the cover gas flows into and out of the cell 22, respectively. As more fully explained below, melt 28 generally oxidizes rapidly in the presence of air or oxygen and it is preferable to have a relatively inert cover gas flowing over the melt 28 to prevent such oxidation. Although any cover gas inert to the melt 28 is appropriate, a nitrogen cover gas containing water vapor has been found to be preferable. The cover gas may be water-free (anhydrous) or can be from 0-100% water saturated. Other gases found to be suitable include but are not limited to the noble gases. The cover gas can be preheated prior to it being introduced to the cell 22 such that the introduction of the cover gas will not affect the isothermal nature of the cell 22. Alternatively, if the cover gas is not the same temperature as the cell 22, the cell 22 will come to equilibrium after a period of time. Therefore, while it has been found that the flow rate of the cover gas is unimportant, a flow rate that does not produce a large temperature gradient within the cell 22 is preferable.

The temperature of the electrodeposition cell, its envelope, and a large heat capacity metal thermal ballast cup 24 holding the assembly is monitored conventionally, such as by thermocouple 26, and controlled using a temperature controller (not shown) (Omega brand) to drive a hotplate (not shown). The ballast cup 24 is used to maintain the electrodeposition cell at a constant temperature so as to preserve the isothermal nature of the electrodeposition process. Ballast cup 24 may be any conventional thermal ballast suitable for use at the desired temperature such as, for example, fluid baths, metal cups, or sand baths.

6. Method:

In a typical deposition, approximately 20 grams of KOH (Baker, Reagent) is placed in a 15 cc crucible 12 and melted at the reduced melting point of 180° C. The lowered melting point is presumed to result from the known high water content of commercial KOH. KOH of any form may be used. After achieving an operating temperature, the other components of the melt 28, (typically approximately 1.60 grams of $Ba(OH)_2.8H_2O$ (Aldrich, 98%) and approximately 2.37 grams of $Bi_2O_3$ (Aesar, 99%)) are added with stirring to aid dissolution. Although the amount of KOH, $Ba(OH)_2.8H_2O$, and $Bi_2O_3$ can be varied, it has been found that a weight ratio of KOH:$Ba(OH)_2.8H_2O$:$Bi_2O_3$ of approximately 5:0.4:0.6 achieves the desired melt 28 solution. A quiescent solution is maintained during deposition in order to avoid incorporation of particles from this saturated solution into the growing deposit. Maintenance of an inert atmosphere is necessary in order to avoid spontaneous or air oxidation of this chemical system. Any of the noble gases and several other elements such as nitrogen are suitable as cover gases to serve as the inner atmosphere in order to prevent spontaneous oxidation. This spontaneous oxidation can be quite rapid at elevated temperatures. A cell 22 holder contains the electrodeposition cell, supports the electrodes 14, 16, 18, and allows maintenance of a water vapor saturated nitrogen cover gas flow (about 3 cc/min.) over the cell.

The constant $pH_2O$ may influence the long term stability of the reference electrode 18 potential.

Undissolved $Bi_2O_3$ is sedimentated to the bottom of the crucible 12, leaving a virtually crystal clear solution. Electrolysis of this crystal clear solution is initiated at an applied potential typically between 0.6 and 0.9 V, preferably about 0.7 V, versus the Bi reference electrode 18. Deposition on the anode 14 of Bismuth based materials begins immediatley, and is terminated by withdrawing the crystal laden electrode 14 from the melt 28 after any desired period of time. The useable time is limited by the depletion of Bi from the solution through deposition of Bi metal (cathodic) and Bi oxides (anodic), to periods on the order of 48 hours for the system described above. Larger crucibles and even larger cells used in conjunction with larger quanities of melt solution can be used to produce more and larger samples. Shorter deposition times will result in thin films, while longer deposition times will result in large crystals. The continuum comprising thin film-thick film-small crystal-large crystal can be achieved by selecting an appropriate deposition time. The Examples given below illustrate this. Samples are air cooled, rinsed and ultrasonically cleaned in distilled water, then allowed to air dry. Some compositions, most notably the highest Tc materials, have been observed to change color rapidly when in contact with the atmosphere. Other samples appear quite stable.

A typical set of reaction parameters is given in Table 1.

TABLE I

| | Typical Reaction Parameters | | | |
| | Example* | | | |
| | 1 | 2 | 3 | 4 |
| --- | --- | --- | --- | --- |
| Cell temperature | 240° C. | 260° C. | 260° C. | 260° C. |
| Cell composition | Teflon | Teflon | Teflon | Teflon |
| Cell volume | 15 cc | 100 cc | 1000 cc | 100 cc |
| Cell potential | 0.7 V | 0.7 V | 0.7 V | 0.7 V |
| Anode (cathode) diameter | 0.5 mm | 1.0 mm | 1.0 mm | 1.0 mm |
| Deposition Time | 40 min. | 66 hr. | 480 hr | 168 hr |
| Solution composition: | | | | |
| KOH | 20.0 g | 80.0 g | 800.0 g | 146.0 g |
| $Ba(OH)_2.8H_2O$ | 1.60 g | 6.4 g | 64.0 g | 6.4 g |
| $Bi_2O_3$ | 2.37 g | 9.48 g | 94.8 g | 9.48 g |

*Examples 1, 2 and 3 are the results of the deposition of $Ba_{0.62}K_{0.38}BiO_3$, while Example 4 is the result of the deposition of $Ba_{0.64}Rb_{0.36}BiO_3$.

The reagent grade KOH, which typically contains approximately 0.145 g of $H_2O$ per gram of KOH, may be used without further purification. The KOH, in the form of pellets, is loaded into the crucible 12 and lowered into the preheated bath within the cell 22. Because of freezing point lowering attributable to the high water content of the KOH, a transparent melt 28 was usually obtained by 200° C. The other components of the melt 28, $Bi_2O_3$ and $Ba(OH)_2.8H_2O$, were added at this time with stirring to aid solute dissolution. Upon attainment of the operating temperature, the stirring was stopped, the electrodes 14, 16, 18 were inserted into the melt 28 and electrolysis was begun. Experiments were terminated by withdrawing the electrodes 14, 16, 18 from the melt 28 while still under current control. Immediately upon cooling to room temperature, the electrodes 14, 16, 18 were rinsed in distilled water then allowed to air dry. These samples, still adhering to the substrate, were used for scanning electron microscopy and microchemical analysis. Powder samples for diffraction studies were harvested into distilled water by vibrating the material off of the substrate using a commercial ultrasonic cleaner. The samples were then decanted and allowed to air dry.

c. Characterization and Results:

Visual examinations of the samples were made using an inverted optical metallographic microscope (Leco-/aus JENA).

Scanning electron microscopy (SEM) and energy dispersive x-ray (EDX) analyses were performed using a Phillips Model 505 SEM equipped with a Tracor Northern 5500 data aquisition system and semiquantitative analysis software. Multiple sites were probed with 25 kV excitation using a 100 nm spot size (beam diameter). Data were collected over the range 0–25 kV. The M line of Ba, the K line of K, and the L line of Ba were fit to yield atomic percentages of these elements.

X-ray diffraction patterns of the samples were acquired using a Scintag XDS 2000 Theta/Theta X-ray Powder Diffraction system. This wide angle powder diffractometer with two independently controllable high resolution angles and a solid state liquid nitrogen cooled germanium detector system is controlled by a Microvax 2000E computer. Data were taken for two-theta values in the range $15 < 2\theta < 60$ degrees, with a scan rate of 10 degrees per minute using monchromated high intensity Cu radiation. Energy windowing and software subtraction were used to obtain Cu $K\alpha_1$ radiation equivalent diffractograms, which were then analyzed on the system's Microvax.

Magnetization studies were performed using a Model MPMS2 SQUID magnetometer (Quantum Design, Inc.). The sample was cooled in zero field to 5K and then a 5 Oe field was applied. The magnetization was measured as a function of temperature to 35K to obtain the diamagnetic shielding curve. The sample was then cooled in the applied 5 Oe field to 5K and remeasured to 35K to obtain the Meissner curve. The trapping curve was obtained by cooling the sample to 5K in a 5 Oe applied magnetic field and then setting the field to zero and measuring the magnetization as a function of temperature to 35K.

Thick coatings of highly faceted irridescent blue to bronze colored crystals were rapidly obtained electrochemically. The coloration of the crystals reflects the potassium content of the deposit. The potassium content, and thus the coloration of the crystals, changed with experimental parameters. Under the conditions shown in Table I, a blue black product was formed. In order to avoid contamination by the crucible material, lower temperatures and Teflon crucibles were usually utilized.

Figure 2A:
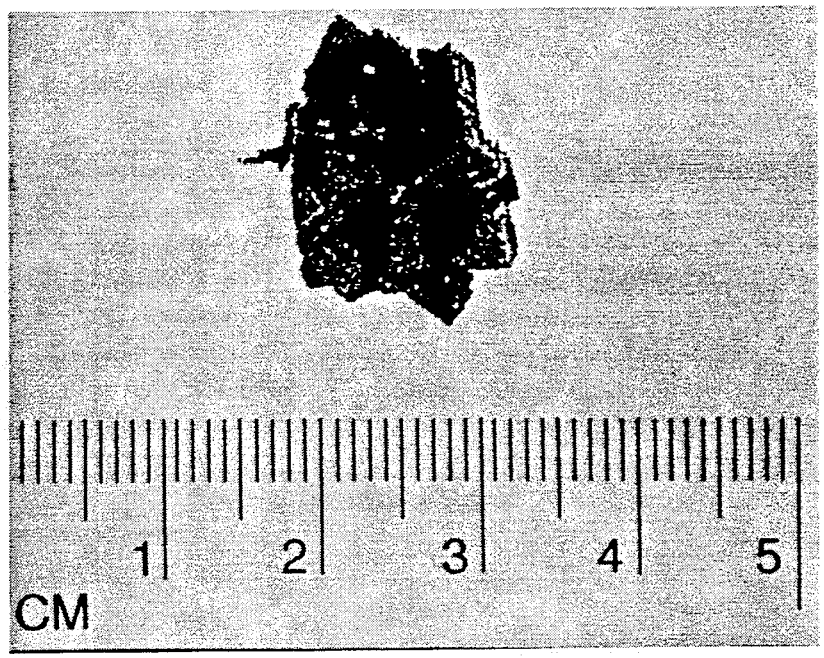
FIG. 2a is a photograph of a BKBO crystalline cluster produced by the present invention.
Figure 2B:
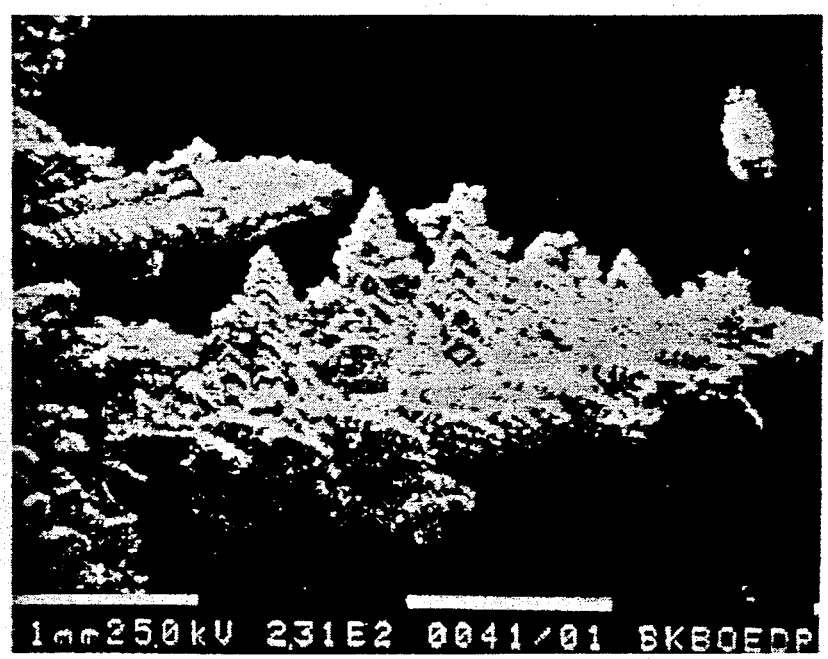
FIG. 2b is a scanning electron micrograph of a BKBO crystallite showing the dendritic growth pattern.
Figure 3:
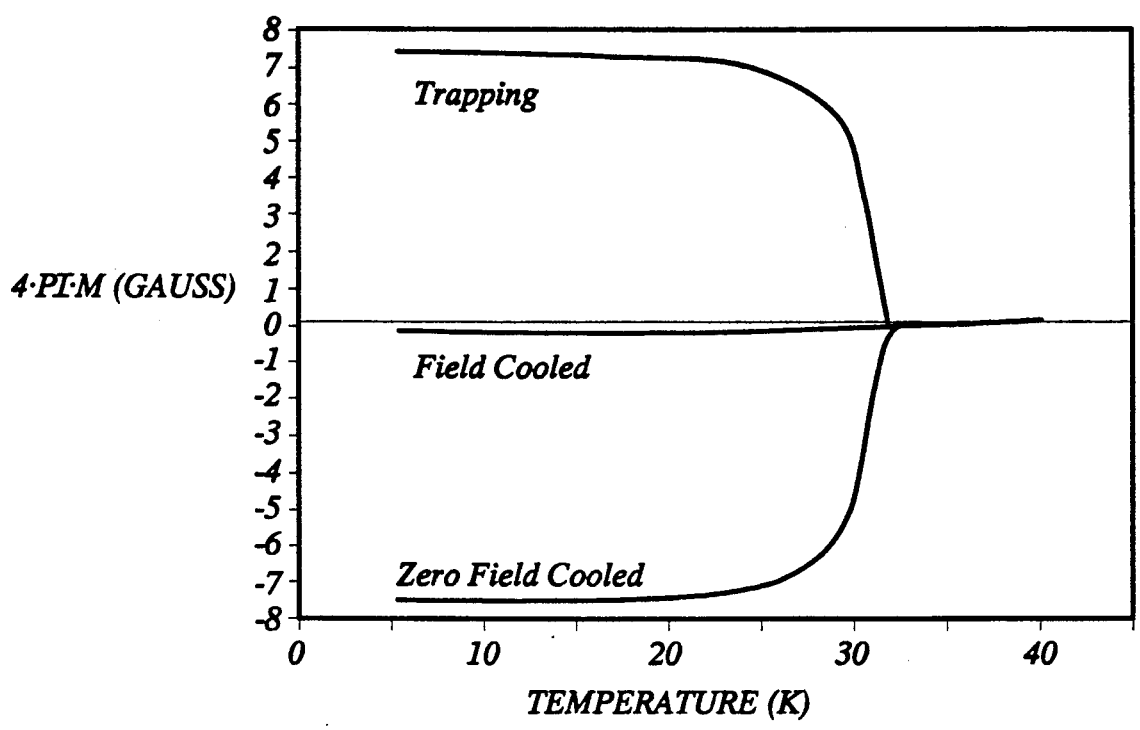
FIG. 3 is a magnetization plot for a BKBO crystal produced by the present invention.
Figure 4:
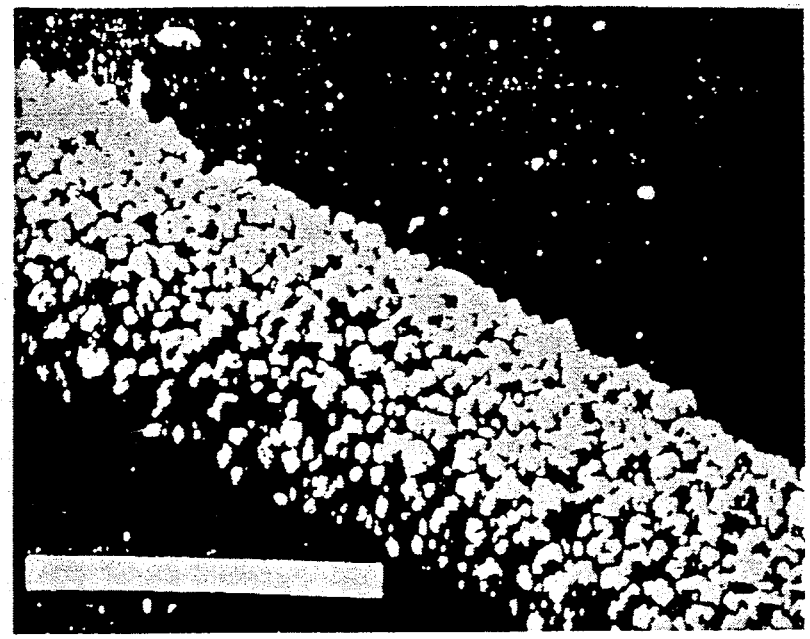
FIG. 4 is a photomicrograph of a BKBO electrodeposit.
Figure 5A:
FIG. 5a is a photomicrograph of BKBO crystallites.
Figure 5B:
FIG. 5b is a photomicrograph of BRBO crystallites produced by the present invention.

A photograph of a representative deposit cluster of crystals is shown in FIG. 2. Crystals with [100] facets greater than 0.5 cm in length are present. Scanning electron micrographs of a representative deposit are shown in FIGS. 4 and 5. It is clear from FIG. 4 that the electrodeposit uniformly covers the platinum wire substrate. This reflects a spatially uniform current density and growth rate, which is to be expected in the electrochemical deposition of highly conducting materials. No indication of moisture sensitivity of the product was observed via SEM. In FIG. 5, the individual crystallites are readily observed. After 40 minutes of deposition, the average crystal size is approximately 50 microns, and often twinned. FIG. 3 shows a magnetization plot from the SQUID for one crystal from the cluster of crystals shown in FIG. 2. The $T_c$ onset determined is about 32K.

Optical Microscopy: Materials prepared with deposition times of 6 hours have been observed to grow as dendrites along [111]. At lower growth temperatures the nuclei and earliest grown crystals are metallic bronze in color. The later grown crystals are bright blue in reflection, which reflect the electronic properties of the material, which are governed by their K content. Materials grown at higher temperatures appear to be more homogeneous, perhaps due to the lower viscosity and thus better mass transport of the flux system.

The growth forms reflect the cubic nature of the lattice. Additionally, the absence of dendritic or [111] directed branching growth indicates that crystal growth has been accomplished at conditions close to equilibrium. Crystals 0.5 mm on an edge have been grown in 3 hours utilizing platinum wire with seed crystals already attached.

SEM/EDX:EDX analysis shows that the later material, which composes the bulk of the material, displays the approximate stoichiometry $Ba_{.6}K_{.4}BiO_3$, the well known superconducting composition.

Figure 6:
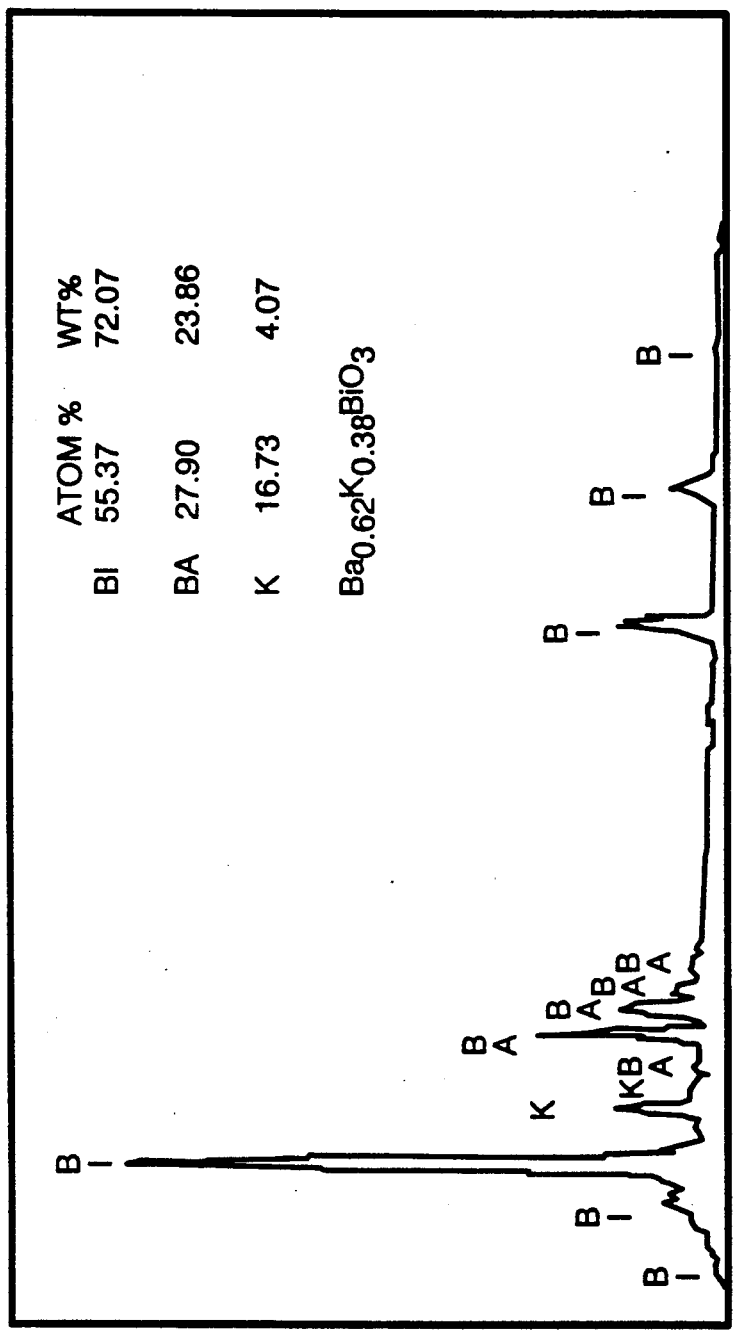
FIG. 6 is an energy dispersive X-ray spectrum and semiquantitative analysis of electrodeposited BKBO crystallite produced by the present invention.

A representative energy dispersive X-ray (EDX) spectrum is shown in FIG. 6. An average of the analyses of debris free spots on several crystals yields a composition in atom percent of the crystals of Ba:$30+/-2\%$; K: $20+/-2\%$; and Bi:$50 +/-2\%$. The composition, as obtained from EDX analysis, is $Ba_{.6}K_{.4}BiO_3$. Because of high absorbance of the Ba and K X-ray emission lines, the accuracy of the stoichiometry of these elements may not be well represented by the precision of the measurements indicated above. Material without observable potassium content has been prepared under other electrodeposition conditions, indicating that the potassium content is controllable over a wide range of compositions, and that the observed potassium content does not arise from a surface artifact.

X-ray Diffraction: Analysis of the X-ray diffraction pattern for the low temperature grown material indicates significant broadening of the peaks, which are readily indexed as cubic. The pattern is not readily refined, and indicates some spread in lattice constants, consistent with the EDX and optical observations. Material grown at higher temperatures gives much sharper diffraction peaks. The intensities are not well fit using Rietveld methods; however, there may be significant texture. The lattice parameter for the highest $T_c$ material refines to be 4.2913 A. This lattice parameter translates to the formulation $Ba_{.636}K_{.364}BiO_3$. This composition is quite near that predicted for the metal/insulator phase boundary at 0K, which is also where the highest Tc should occur.

Magnetic Measurements: AC SQUID measurements indicate that the product prepared at lower temperatures is superconducting, and has a low $T_c$ (20K onset) and broad (8K) superconducting transition. These findings support the conclusions that this crystalline product is inhomogeneous, and very likely is strained by the gradient in lattice parameter produced by the gradient in K content. In contrast, the material shown in FIG. 2 displays an unusually high $T_c$. The magnetic transition, displayed in FIG. 3, is sharp (2K width), and the onset (about 31.8K) is far above transition temperatures usually reported for powders of this material.

The quite high $T_c$ onset observed for this material was unexpected, but can be explained by the use of a low temperature synthetic procedure which allows the avoidance of the instabilities described above. Compositional instabilities related to the metal/insulator phase boundary are not expected to be relevant for the stoichometries produced, at the synthesis temperature. The use of electrochemical preparation technique leads to the production of material with a $T_c$ approximately 10% higher than normally observed for ceramically prepared powders. It must be noted, however, that powders are not usually synthesized with targeted compositions of X=0.3643. These results would appear to indicate that there is an essential difference between the ceramic and low temperature electrochemical approaches to production of this material.

The electrodeposition reaction can be viewed as a bismuth oxide polymerization process resulting in a 3-D polymer stuffed with K and Ba cations. That is, a polymer crosslinked in two dimensions perpendicular to the growth direction is formed, and incorporates ions from the melt as growth progresses. Potentiostatic control of the electrode process is used to maintain a constant rate of polymerization, and therefore to maintain a steady state doping rate. This is only possible if the solution composition remains constant, a situation which is best approximated by use of large solution volumes. Relatively long deposition times necessarily lead to compositional variation in the product in closed systems. Solution or local depletion of Ba content drives the dopant profile to higher K contents with increasing time. The use of higher temperatures leads to higher deposition currents, due to faster mass transport rates. Higher temperatures also lead to crystals with a more cubic morphology, presumably due to higher surface ionic mobilities.

Annealing does not necessarily appear to be viable in view of the thermal sensitivity of these materials. Annealing at 400° C. in air (1 hour) has not been found to improve the less than ideal materials, or to have detrimental effects on the high $T_c$ crystals. This indicates that the oxygen content of these materials is relatively stable and high.

Large regions (3 mm dia.) of the larger crystals do appear to be homogeneous via EDX analysis, and small single crystals grown quite quickly may be quite homogeneous. Therefore this method can deliver extraordinarily large, high quality, high $T_c$ crystals, which may be of great value for optical studies, which are highly surface sensitive, temperature dependent X-ray structural studies, which require reasonably small samples, magnetization and flux pinning studies, heat capacity studies, and tunneling studies.

This deposition process also is directly applicable to the Ba-Rb-Bi-O and Ba-K-Rb-Bi-O systems, by using RbOH in place of KOH, or a mixture of KOH and RbOH.

ELECTROCRYSTALLIZATION AND CHARACTERIZATION OF POTASSIUM BISMUTHATE

1. Introduction:

Single crystalline potassium bismuthate(V)-hydrate $KBiO_3 \cdot xH_2O$ is obtained by a low temperature anodic electrocrystallization method in a potassium hydroxide molten flux. The crystal is cubic in structure with lattice a=10.000(7)A. Powder samples of anhydrous potassium bismuthate(V) $KBiO_3$ have been prepared under high temperature and pressure conditions. The structure of anhydrous $KBiO_3$ determined by powder X-ray diffraction has been reported as isostructural with $KSbO_3$. The present process allows the growth of single crystalline $KBiO_3 \cdot xH_2O$ by low temperature anodic electrocrystallization in a molten KOH flux. In contrast to the thermal reaction methods, the low temperature electrochemical method can provide two important advantages. First, the oxidative power is readily delivered to the desired crystal/solution interface, precisely controlling oxidation in the process. Second, the product nonstoichiometry caused by the volatility of alkaline oxide at high temperatures can be avoided by this low temperature technique. The crystal structure has been determined by single crystal X-ray diffraction and the chemical composition has been investigated.

2. Crystal Growth:

The growth of $KBiO_3$ crystals is carried out in cell 22. A standard installation, such as disclosed above, comprises a high current potentiostat (Bioanalytical Systems, SP-2), a Teflon cell with a polycrystalline bismuth reference electrode, and platinum working and auxiliary electrodes. The molten flux in a 100 ml Teflon cell typically consists of 9.48 g of $Bi_2O_3$ dissolved in 80 g KOH. The temperature of the cell is controlled by an Omega temperature controller at 200° C. The lowered melting point of KOH flux is presumed to result from the known high water content of commercial KOH. Upon sedimentation of excess, undissolved $Bi_2O_3$, electrolysis of the clear solution is begun at an applied potential 0.8 V vs. the Bi reference electrode. The useable time is limited by the depletion of Bi from the flux through deposition of Bi metal on the auxiliary electrode and $KBiO_3 \cdot xH_2O$ on the working electrode. A 72 hours experiment for the system described above was used to grow cubic crystals with 2 mm×2 mm cubic facets.

3. Characterization:

Scanning electron microscopy and energy dispersive X-ray analysis were performed using a Phillips model 505 SEM equipped with a Tracor Northern 5500 data acquisition system and a semiquantitative analysis program. EDX data were collected over the range 0-20 KV. The K$\alpha$ line of K and the M$\alpha$ line of Bi were used to perform the semiquantitative analysis. A Mark II Jarrel Ash 965 Inductively Coupled Argon Plasma emission spectrometry was used to determine the elemental concentrations.

Figure 7:
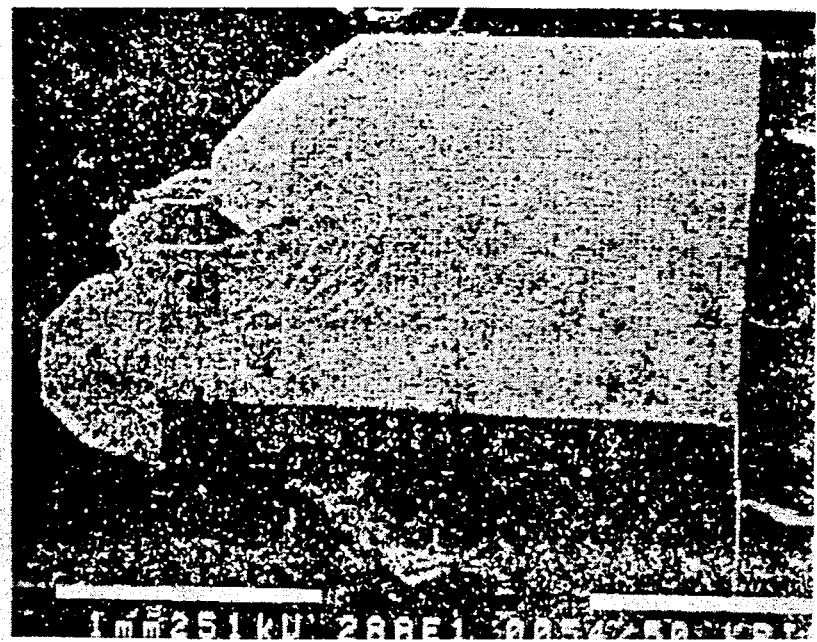
FIG. 7 is a scanning electron micrograph of a cubic $KBiO_3.xH_2O$ crystal.
Figure 8:
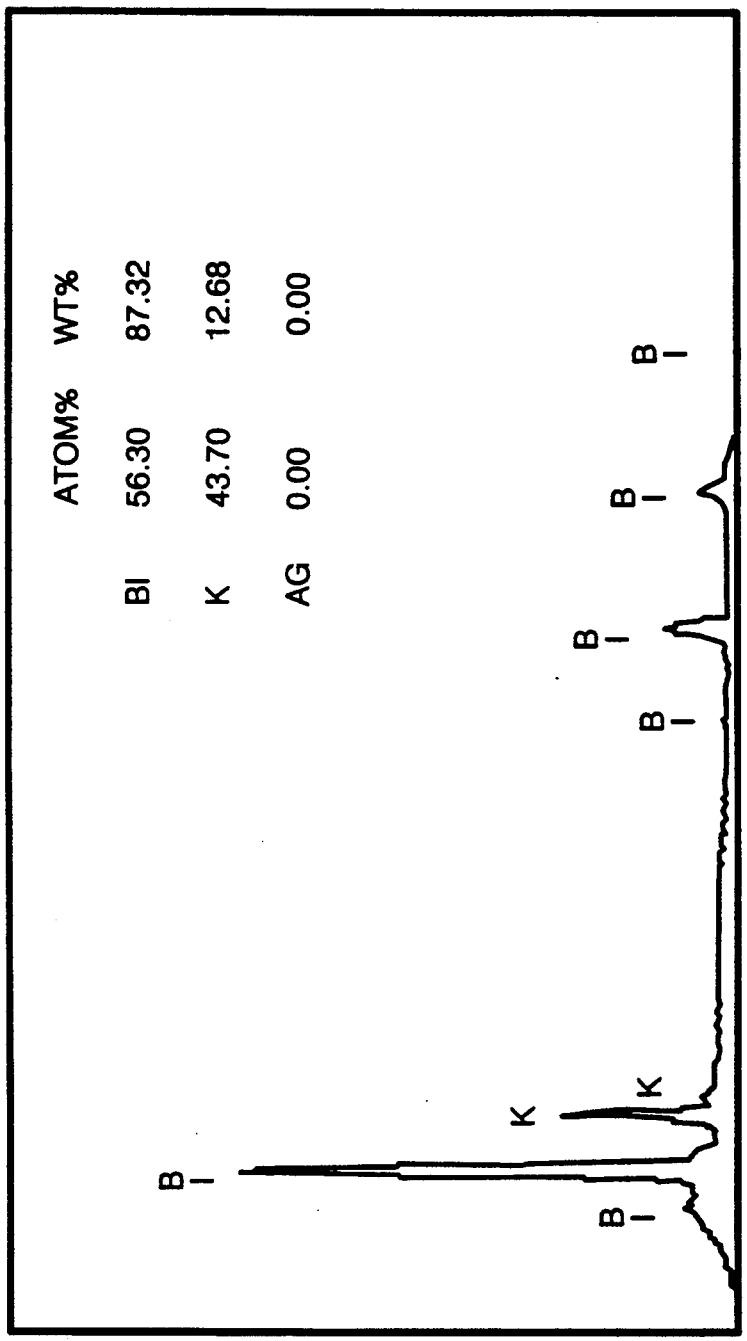
FIG. 8 is an energy dispersive X-ray spectrum of $KBiO_3.xH_2O$ crystal.

4. Results and Discussion:

Although the Bi(III) complex ion in the molten flux begins oxidation to Bi(V) at approximately 0.7 V vs. the Bi reference electrode as determined by cyclic voltammetry, potentials lower than 0.75 V have not been observed to yield crystal growth in 4 hour long experiments. Crystals grown with 72 hours electrolysis time at 0.8 V are cubic in shape with 2 mm×2 mm facets and are shown in FIG. 7. The $KBiO_3 \cdot xH_2O$ single crystal is not readily dissolved in acid. For the ICP-AES quantitative analysis, an aqua regia reagent is used to dissolve the crystal then diluted with deionized water. The ICP-AES quantitative analysis show the potassium and bismuth elemental mole concentrations are very close to a 1 to 1 ratio in good agreement with the SEM/EDX result shown in FIG. 8. SEM/EDX quantitative values for Bi suffer from sample selfabsorption, as indicated in FIG. 8. The crystal's color varies from transparent-red to dark-red depending upon the thickness of the crystal.

Figure 9:
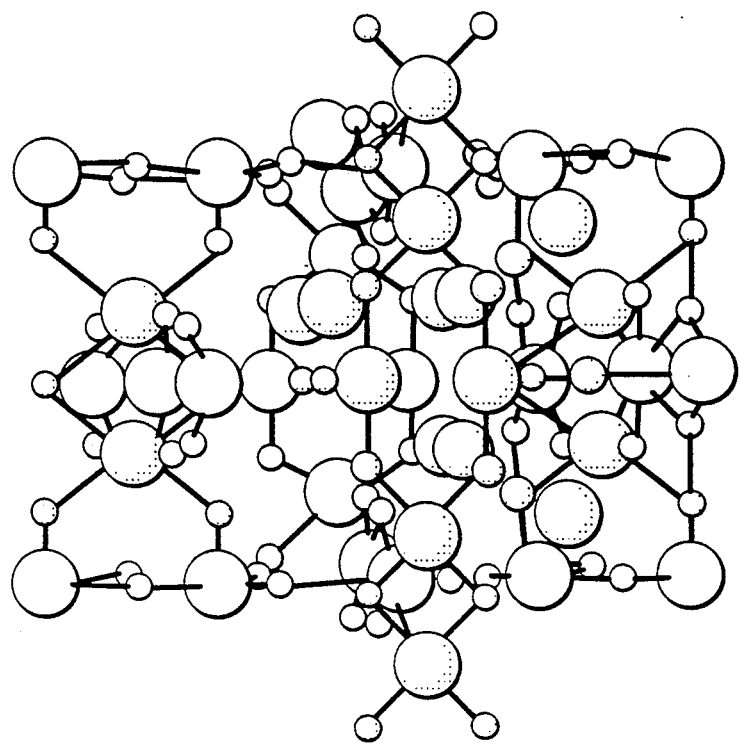
FIG. 9 is a crystal structure of $KBiO_3 \cdot xH_2O$ unit cell determined by single crystal X-ray diffraction.
Figure 10:
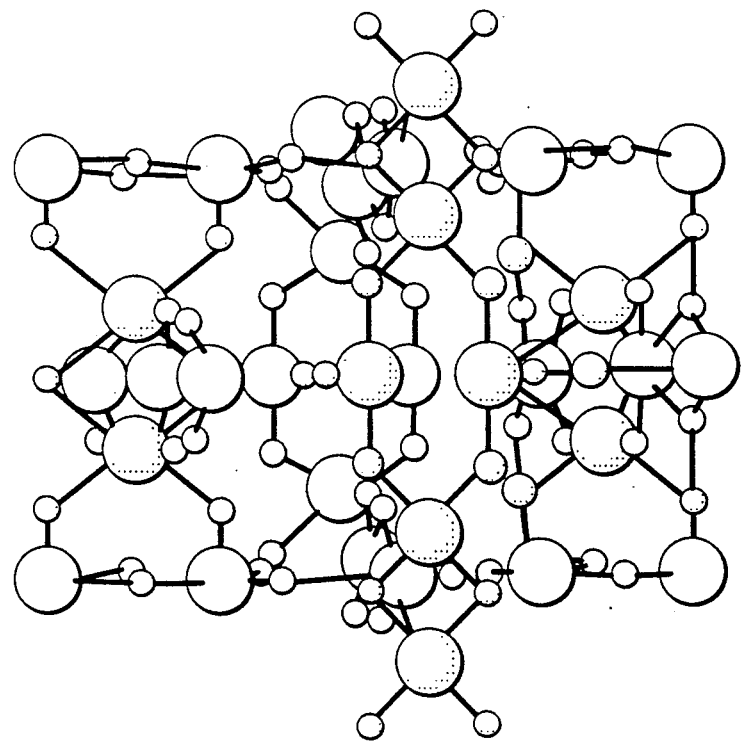
FIG. 10 is a crystal structure of $Bi_{12}O_{36}$ framework in the $KBiO_3 \cdot xH_2O$ unit cell.
Figure 11:
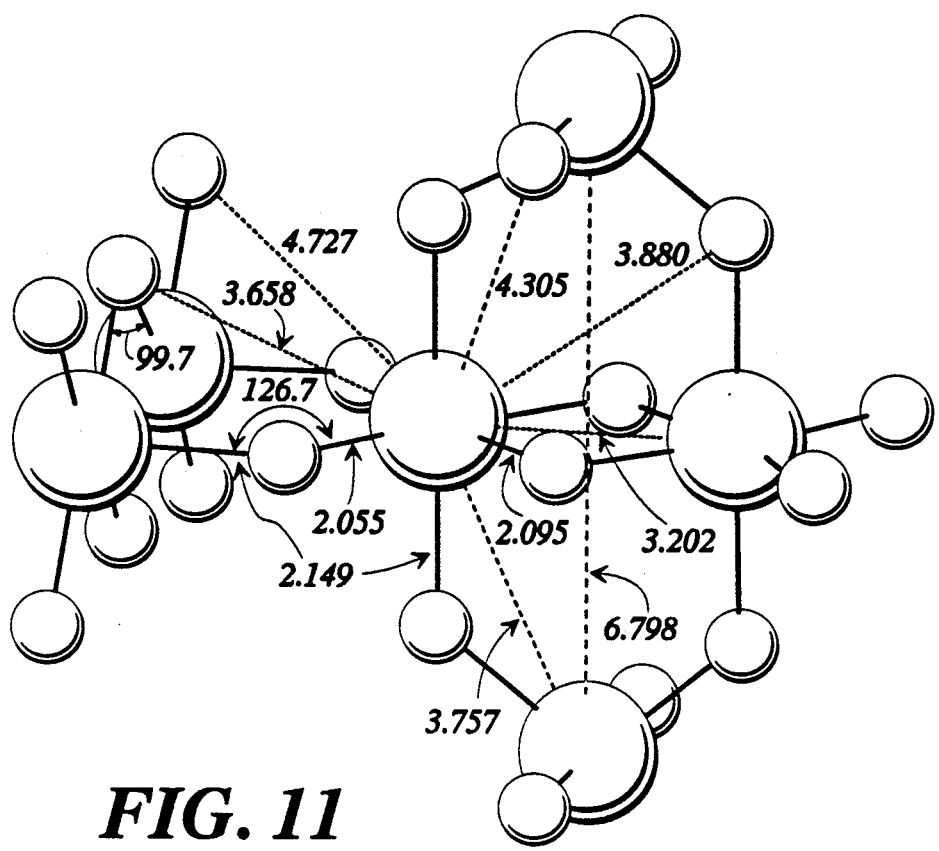
FIG. 11 are the bond distances and bond angles in $KBiO_3 \cdot xH_2O$ crystal determined by single crystal X-ray diffraction.

The typical crystal structure based on the single crystal X-ray diffraction data is shown in FIG. 9. This confirms the previous structure reports determined from powder X-ray diffraction data. The cubic structure contains the $Bi_{12}O_{36}$ framework which is shown in FIG. 10. The framework can be seen as constructed by continuously connecting two oxygen pairs from two $Bi_2O_6$ units to a $Bi_2O_6$ unit that has an oxo-bridge edge-shared structure between two bismuth centers and forming a six coordinated octahedral structure at each bismuth atom. In this framework there are two types of cavities, potassium ions occupy 8 equivalent corner cavities and the other 4 potassium atoms may have tetrahedral arrangement or random occupancy at the other 8 equivalent cavities in the center of the cubic unit cell. Detailed structural bond distances and bond angles are shown in FIG. 11.

This electrochemical reaction can be represented as the following formula:

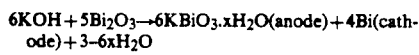

When the constant potential is applied, $KBiO_3.xH_2O$ crystals are formed at the working electrode and Bi metal is reduced on the auxiliary electrode. Water may be important in this system, as stabilization of the structure by incorporation of $H_2O$ is possible.

Based on the crystal structure, the nucleation at the electrode surface can be viewed as a $Bi^{+3}$ species $[(OH)_2BiO_2Bi(OH)_2]^{-2}$ or a $Bi^{+5}$ species $[(OH)_4BiO_2Bi(OH)_4]^{-2}$ complex ion polymerization process resulting in a three dimension polymer stuffed with potassium ions. The polymerization process might possess a metal undergoing an oxidative addition or simply elimination of water depending upon the structure(s) of bismuth complex ions in the molten flux. Currently, the true structure of the starting complex ions have not been identified by spectroscopic techniques, chiefly because the extremely corrosive nature of KOH molten flux limits the selection of cells. Therefore, other possible structures of the bismuth complex ions cannot be eliminated.

Successful crystal growth must be performed at potentials higher than the bismuth (III) oxidation potential. It can be assumed that the low concentration of higher valence ($>+3$) bismuth complex ions in the bulk solution at the beginning and the high solubility of this species presents an obstacle to $KBiO_3.xH_2O$ crystal nucleation and growth. Saturation in the diffusion layer seems necessary to obtain stable crystallization. Potentials lower than 0.8 V also may result in the contamination of crystals from dissolution of the unprotected metal electrodes.

Single crystals of $KBiO_3.xH_2O$ have been grown by a potential controlled low temperature anodic electrocrystallization technique. No strong correlation was found between the temperature and crystal growth. The most important parameter is the applied potential, and it should be above 0.75 V to obtain high quality crystals.

ELEMENTAL SUBSTITUTIONS IN $Ba_{1-x}K_xBiO_3$

In current high $T_c$ superconductor research, even before the superconducting mechanism is fully understood, chemical substitution is one of the most often adopted experimental methods to raise the superconductor transition temperature. The most successful example is in the La-Ba-Cu-O system where substituting yttrium for lanthanum raised the $T_c$ above liquid nitrogen temperature and strongly impacted superconductor research. In this research, chemical substitution is carried out to determine the correlation between composition and properties of superconductors in the BKBO family. Substitutions of the BKBO superconductor have been performed on the K, Ba, and Bi sites.

2. Experimental:

In elemental substitution experiments, the synthesis condition are basically similar to the anodic electrocrystallization method used for the BKBO system. Slight modifications have been made in each substitution experiment. For Rb and Cs substitution experiments, 99.9% $RbOH.xH_2O$ and $CsOH.xH_2O$ were used as molten fluxes to replace the usual $KOH.xH_2O$ flux used in the normal BKBO experiments. For Sr substitution, $SR(OH)_2$ instead of $Ba(OH)_2.8H_2O$ was added into the molten flux. In the Sb substitution for Bi experiments, the Bi reference electrode in the BKBO system was replaced with a 1 mm diameter Sb electrode and the $Bi_2O_3$ was replaced with $Sb_2O_3$.

Figure 12:
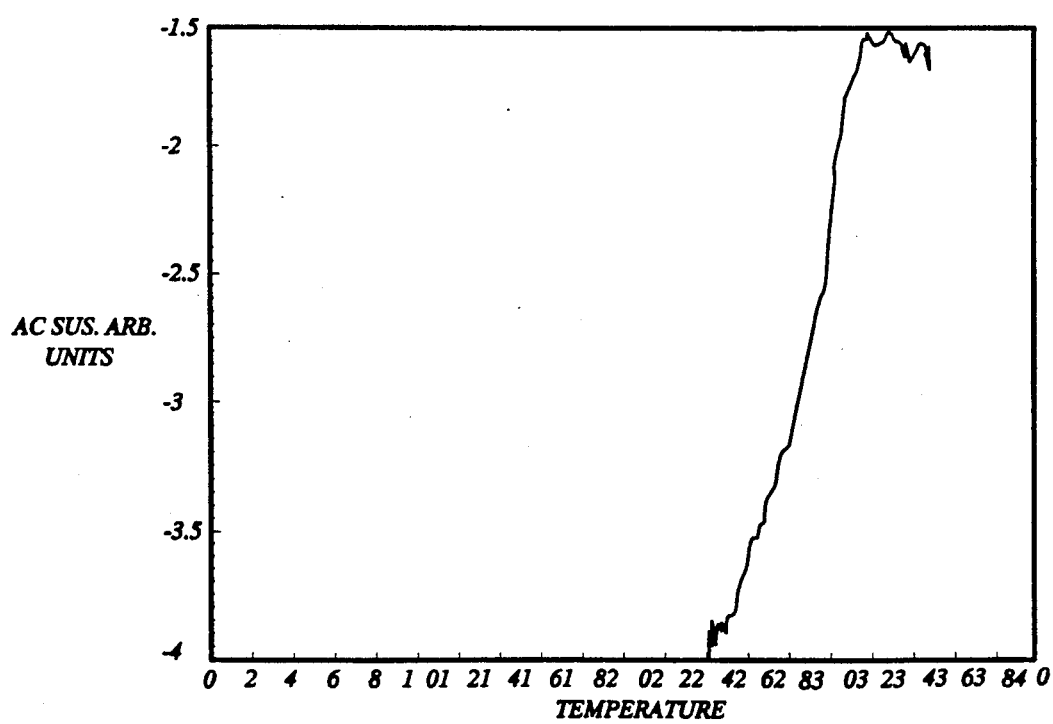
FIG. 12 is a susceptibility plot for crystals grown from the 10% RbOH substitution molten flux obtained by a.c. magnetic susceptibility.
Figure 13:
FIG. 13 is a scanning electron micrograph of crystals grown from a 10% RbOH, 90% KOH BKRBO molten flux.
Figure 14:
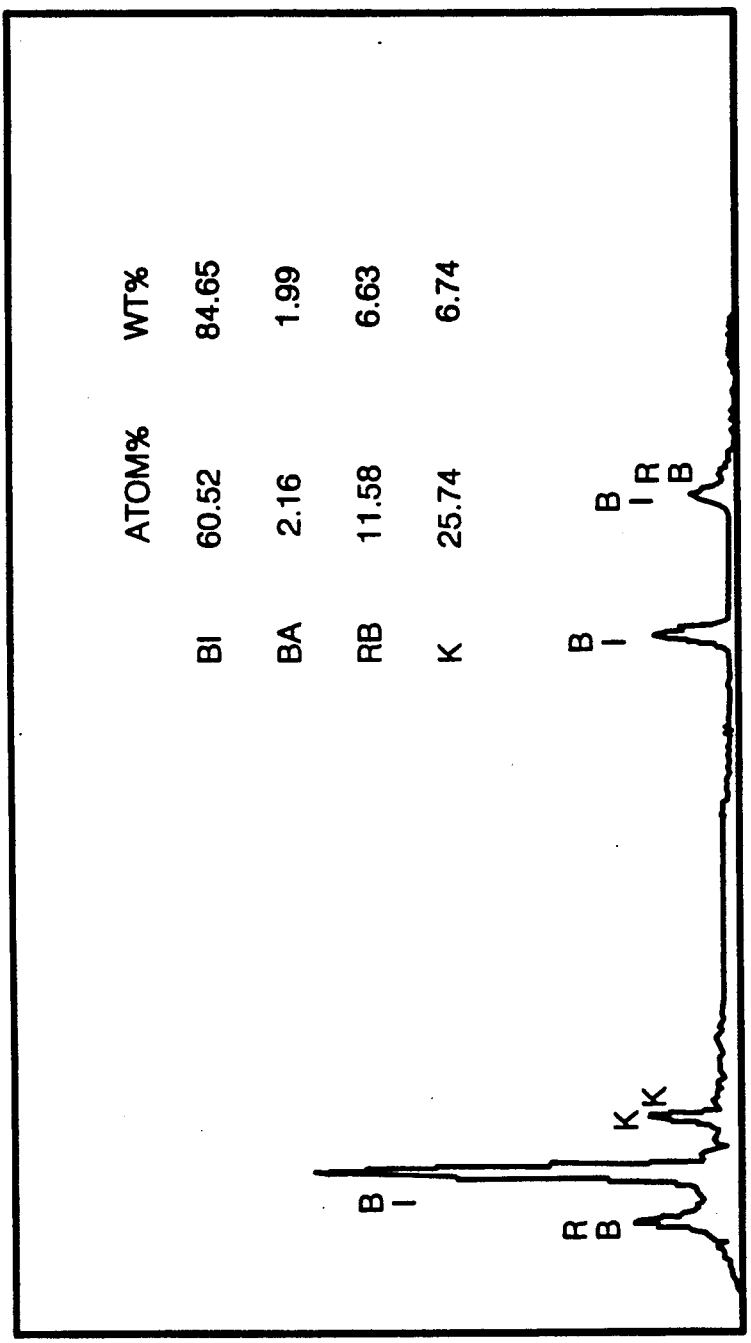
FIG. 14 is an energy dispersive X-ray spectrum of the tetragonal crystals grown from a 10% RbOH substitution molten flux.
Figure 15:
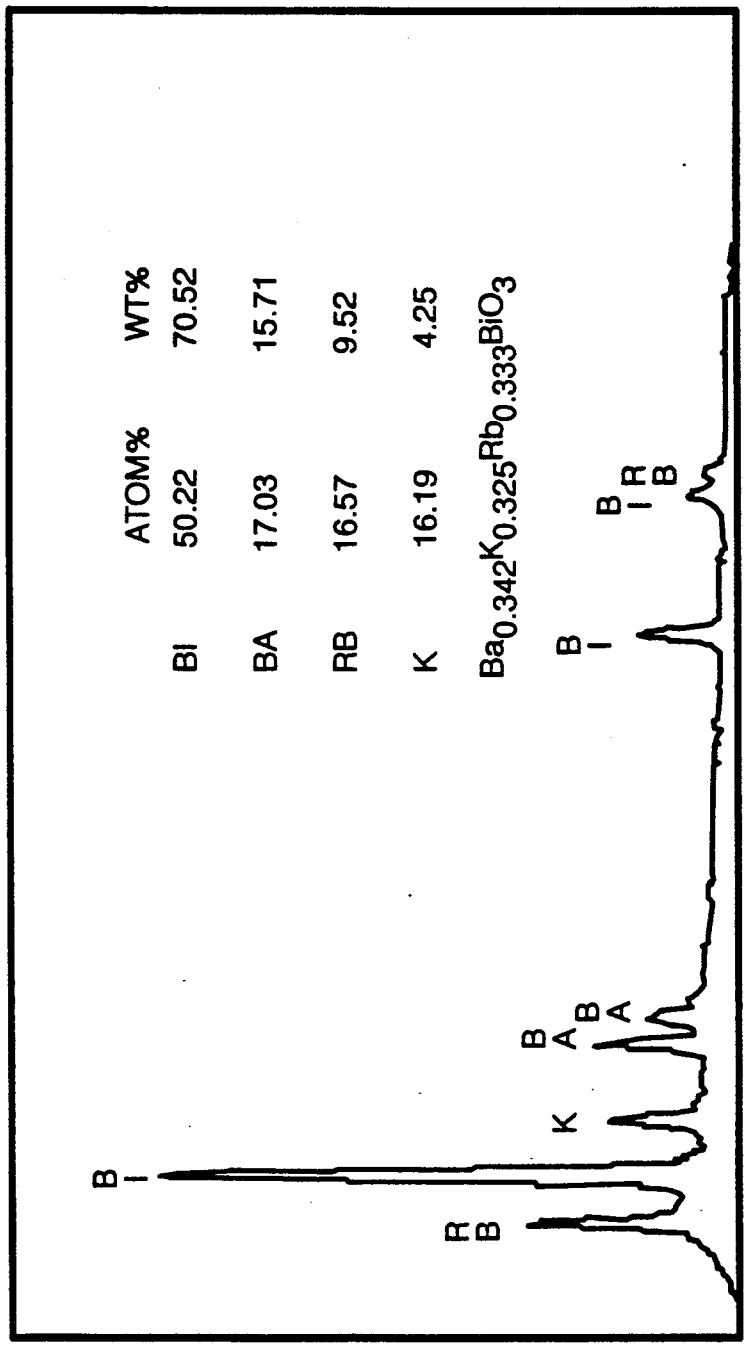
FIG. 15 is an energy dispersive X-ray spectrum of the plate-like crystals grown from a 10% RbOH substitution molten flux.

3. Results and Discussion:

a. Rb Substitution for K:

Partial replacement of K with Rb (10 mole percent) in the BKBO system was found to change the $T_c$ onset slightly and broaden the transition width as determined by the AC magnetic susceptibility measurement shown in FIG. 12. The crystals examined were too small to mechanically isolate for individual $T_c$ measurements. AC magnetic susceptibility measurement for the crystals shows a $T_c$ onset at 31K with a 7K transition width. SEM/EDX microstructure studies and semiquantitative analysis demonstrated that there were at least three different morphologies present: the expected cubic, a tetragonal and a plate-like pink colored form as shown in FIG. 13. Two different EDX spectra and semiquantitative data obtained for the unusual crystals which are tetragonal and plate-like crystals on the electrode surface area are shown in FIGS. 14 and 15. EDX and semiquantitative analysis results show that the tetragonal crystal has an unusually low Ba concentration. The plate-like crystal yields a Ba:Rb:K = 1:1:1 ratio or can be represented as $Ba_{0.342}K_{0.325}Rb_{0.333}BiO_3$. The chemical stoichiometry of the cubic crystals can be represented as $Ba_{0.69}K_{0.28}Rb_{0.03}BiO_3$ which is quite near the metal/charge density wave critical concentration, and can be assigned as the high $T_c$ material. The chemical stoichiometry of the tetragonal and plate-like materials show quite unusual compositions. In the $Ba_{1-x}K_xBiO_3$ system, a K solubility limit at $x=0.5$ has been reported. It would appear that Rb substitution may considerably alter the Ba-K-Bi-O phase diagram.

According to the MSAE results from the Ba-K-Bi-O system, even at a very low Ba concentration (1/10 of the regular amount $Ba(OH)_2.8H_2O$) conditions, only two kinds of crystals, $KBiO_3.xH_2O$ (red) and $Ba_{1-x}K_xBiO_3$ (blue), grow competitively on the electrode. No crystals with $x>0.42$ have been grown even from this high K and ultra low Ba concentration experiment. The solubility limit of the alkali metals are changed significantly by the 10% $RbOH.xH_2O$ substitution and new crystal structures and electronic phases may appear in these materials with novel compositions. Although detailed structure and $T_c$ measurements have not been performed, the broad transition is believed to result from the large variety of compositions in the mixed K and Rb containing cubic crystals.

Figure 17:
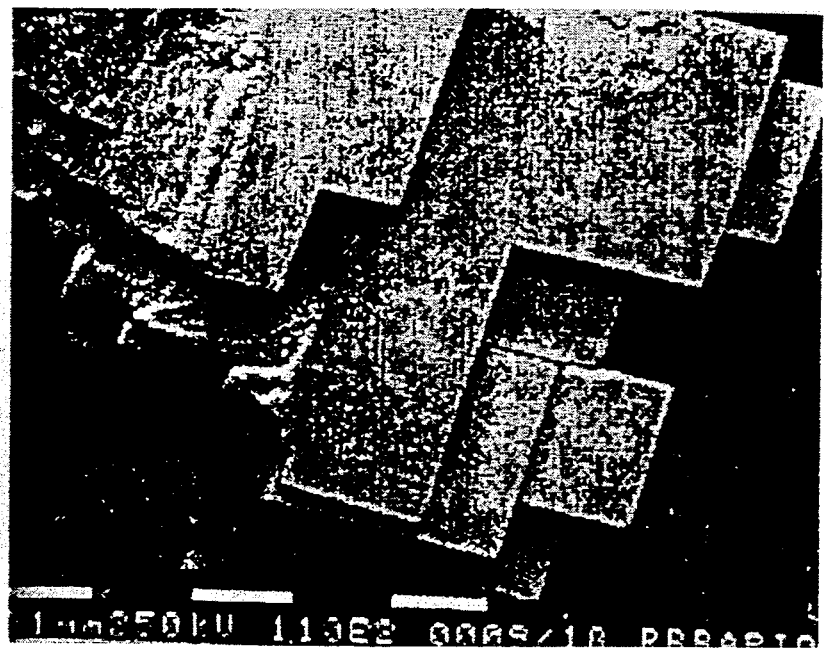
FIG. 17 is an SEM micrograph of the crystals grown from the second step (2 days) in the BRBO molten flux system.
Figure 16:
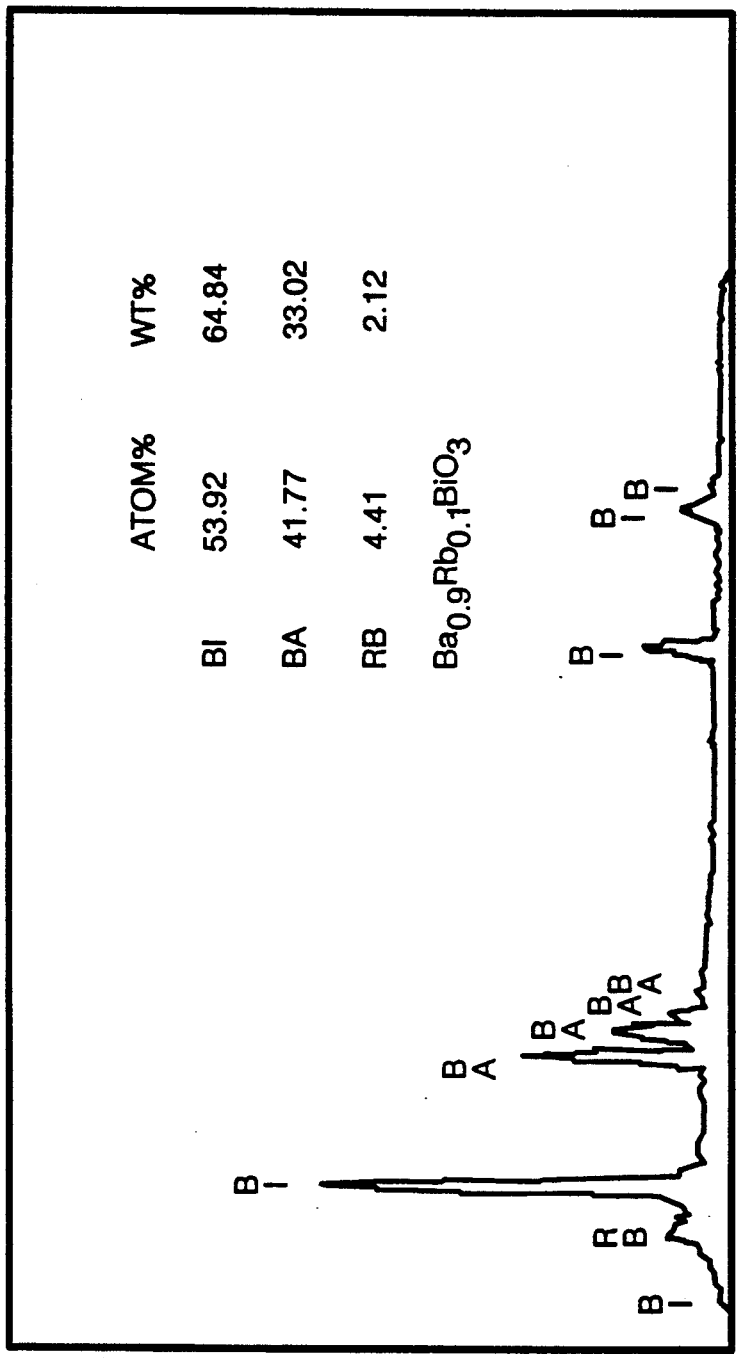
FIG. 16 is an energy dispersive X-ray spectrum of dendritic $Ba_{0.9}Rb_{0.1}BiO_3$ crystallites grown from the first step (3 days/BRBO molten flux system.
Figure 18:
FIG. 18 is an SEM micrograph of the crystals grown from the third step (2 days) in the BRBO molten flux system.

Full replacement of K with Rb in a 24 hour electrocrystallization experiment also produced crystals with a variety of different phases. Distortion of the perovskite structure by the greater difference in Rb vs. Ba ionic radii in comparison with the K vs. Ba radii is expected. The possible structural distortions may make the final products highly sensitive to the synthesis conditions and may bring more structural complexity into the Ba-Rb-Bi-O system. Typically, the substitution experiments were performed with 146.118 g $RbOH.xH_2O$, 9.48 g $Bi_2O_3$, and 6.4 g $Ba(OH)_2.8H_2O$ at 260° C. for 3 days. The applied potential vs. Bi reference electrode used was 0.7 V. Golden colored dendritic crystals were obtained and identified with EDX to have a $Ba_{0.9}Rb_{0.1}BiO_3$ stoichiometry as shown in FIG. 16. The resistively determined $T_c$ of Ba-Rb-Bi-O powder samples has been reported to remain constant at 29K for x values from 0.28 to 0.44. Therefore, even without $T_c$ measurement, these low Rb dopant crystals would not be expected to be high $T_c$ materials. In order to study the correlation among flux concentration, time and crystal composition, a new Ag electrode was introduced into a cell that had been electrolyzed for 3 days. During the following 48 hour electrolysis, many blue colored plate-like Ba-RbBi-O crystals grew on the electrode surface as shown in FIG. 17. After this five day electrolysis, a brand new Ag electrode was introduced into the old solution again and run for 48 more hours. Blue/black laminated crystals were harvested from the electrode as shown in FIG. 18. The EDX results of the plate-like and laminate crystals show that the stoichiometries are similar, ranging from x=0.31 to 0.34 in the $Ba_{1-x}Rb_xBiO_3$ system. One would expect these compositions to be high $T_c$ materials. Although the semiquantitative analysis indicates that these layer structured crystals are in the high $T_c$ compositional range, their crystal morphologies conflict with the previous X-ray results from powder samples that the high Tc $Ba_{1-x}Rb_xBiO_3$ crystals should have the cubic perovskite structure.

Figure 19:
FIG. 19 is an SEM micrograph of the crystals grown from an ultra low (80% reduced) Ba concentration in the BRBO molten flux system.
Figure 20:
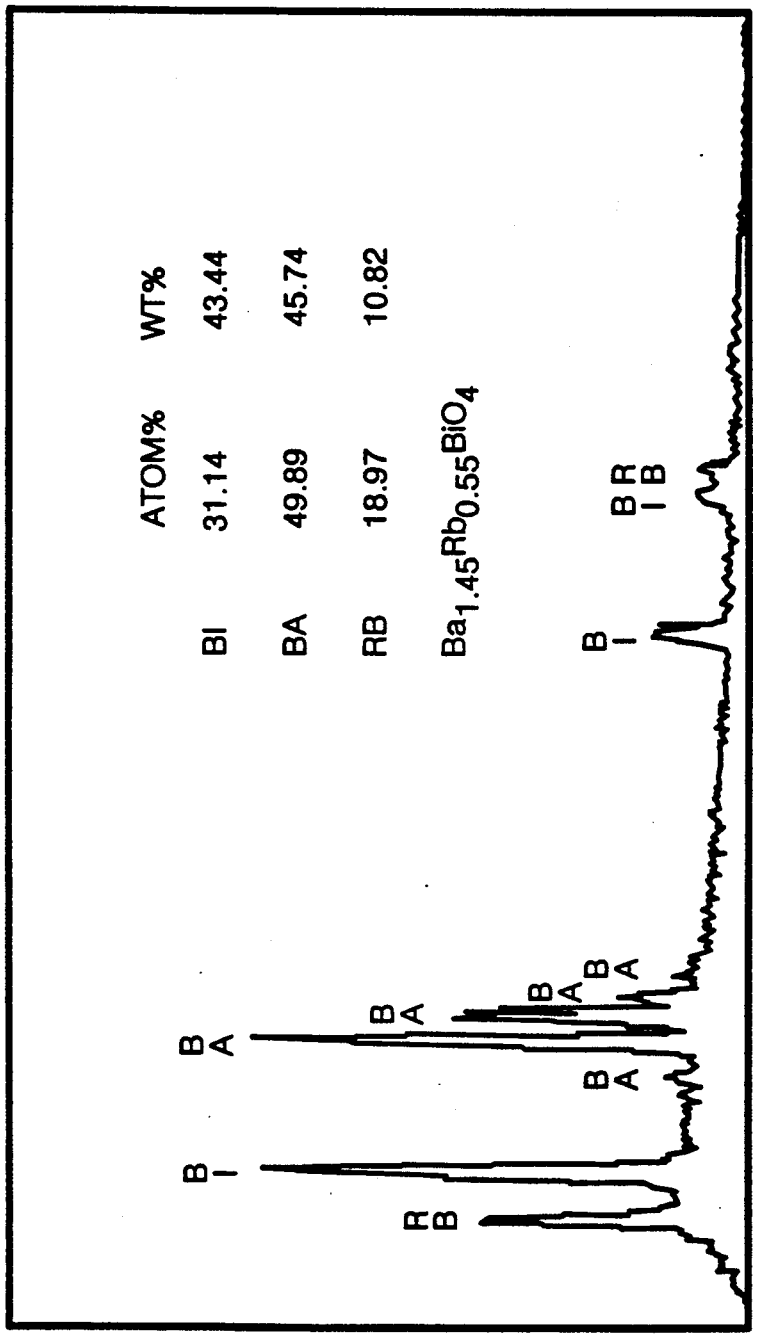
FIG. 20 is an EDX spectrum and semiquantitative analysis for the crystals grown from an ultra low (80% reduced) Ba concentration in the BRBO molten flux system.

In the Ba-K-Bi-O system a 24 hour experiment with an 90% reduced $Ba(OH)_2.8H_2O$ concentration results in a competitive crystal growth with the cubic, low $T_c$ BKBO crystals and $KBiO_3.xH_2O$ crystals forming. According to MSAE results from a Ba free Rb-Bi-O molten flux, pure $RbBiO_3$ is not able to form as crystalline material, in contrast to the $KBiO_3$ system, presumably due to Rb's large ionic radius. Therefore, an 80% reduced $Ba(OH)_2.xH_2O$ MSAE experiment would be expected to produce highly Rb doped Ba-Rb-Bi-O crystals because of the elimination of the $RbBiO_3$ competition effect. However, the result shows that the cubic crystals are not obtained but rather black colored spheres of material are formed on the electrode surface as shown in FIG. 19. Although single crystal X-ray diffraction has not been performed for these materials, according to the EDX result, the material may very possibly have the $K_2NiF_4$ structure instead of the $ABO_3$ perovskite structure, as shown in FIG. 20. This possible structural alteration may strongly dominate the crystal growth mechanism in the low Ba concentration experiments.

Figure 21:
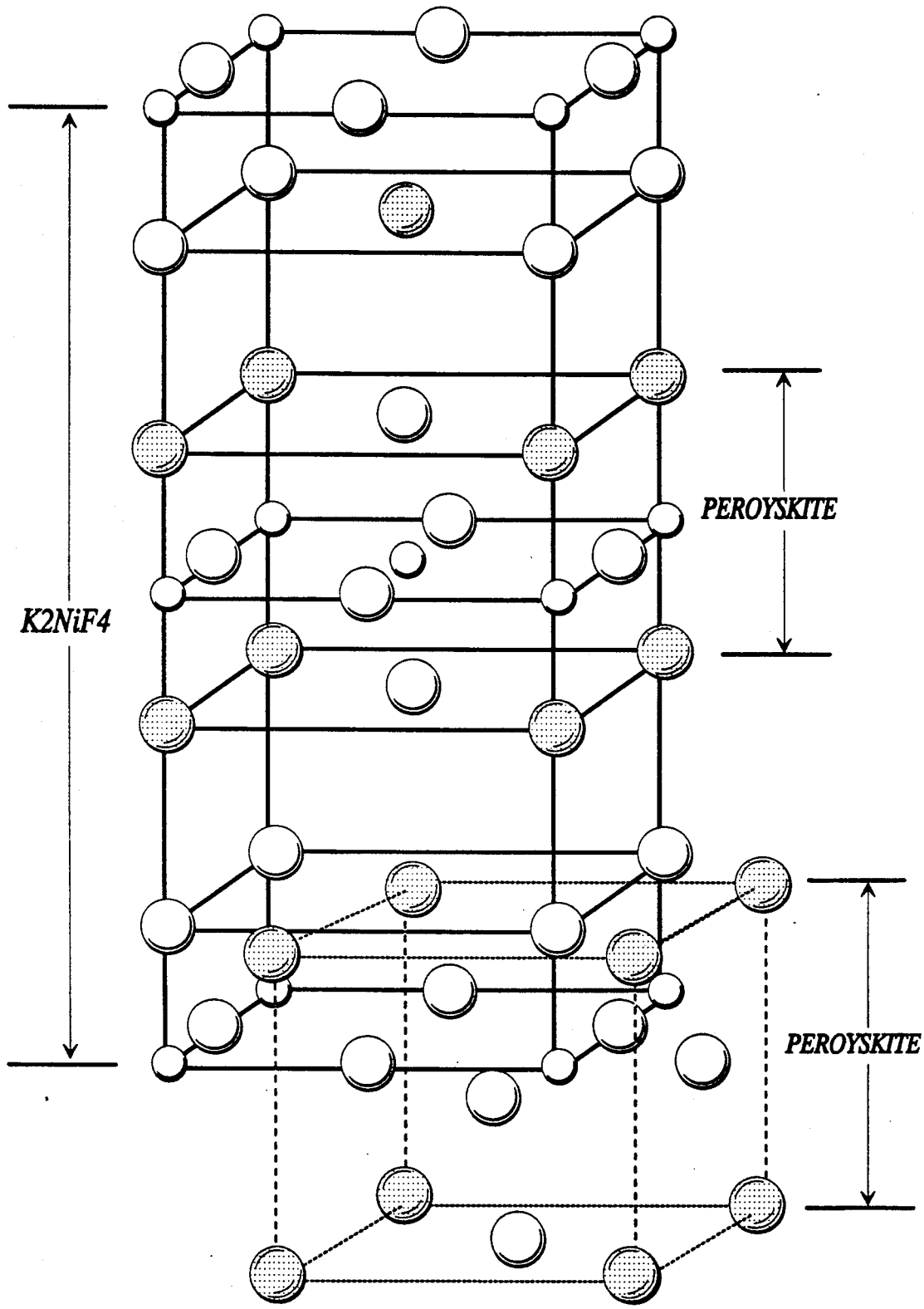
FIG. 21 is a schematic of the structure correlations between $K_2NiF_4$ and Perovskite structures.

The $K_2NiF_4$ (tetragonal) unit cell shown in FIG. 21 clearly points out the strong correlation between the $K_2NiF_4$ and the perovskite $ABO_3$ structures. The central cubic part of the $K_2NiF_4$ unit cell is exactly the same as the $ABO_3$ structure. In addition, a slice through half of the $K_2NiF_4$ unit cell provides a template or environment similar to the perovskite structure, as shown in FIG. 21. During the crystal nucleation step, if one considers the $ABO_3$ structure to be inhibited and the $K_2NiF_4$ structure is formed on the Ag electrode in this low Ba case, then the $K_2NiF_4$ can provide the best environment for two perovskite AB03 unit cells to combine on an emergent dislocation. This imperfect surface of the nucleus could provide convenient sites for ions or clusters to attach and hence form larger crystals by this emergent screw dislocation mechanism. The screw dislocation mechanism, one of the best known crystal growth mechanisms, allows the crystal to grow in two dimensions instead of three dimensions. Therefore, the reason why the $Ba_{1-x}Rb_xBiO_3$ crystals grow with the laminate and plate-like morphologies yet maintain the cubic perovskite stoichiometry is understandable.

Figure 22:
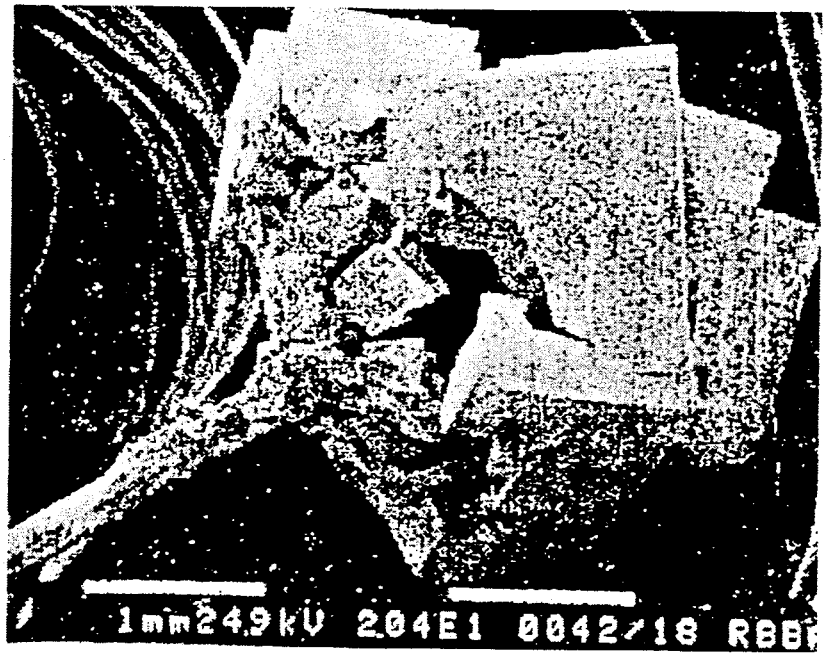
FIG. 22 is an SEM micrograph of cubic $Ba_{1-x}Rb_xBiO_3$ cluster grown on silver electrode.
Figure 23:
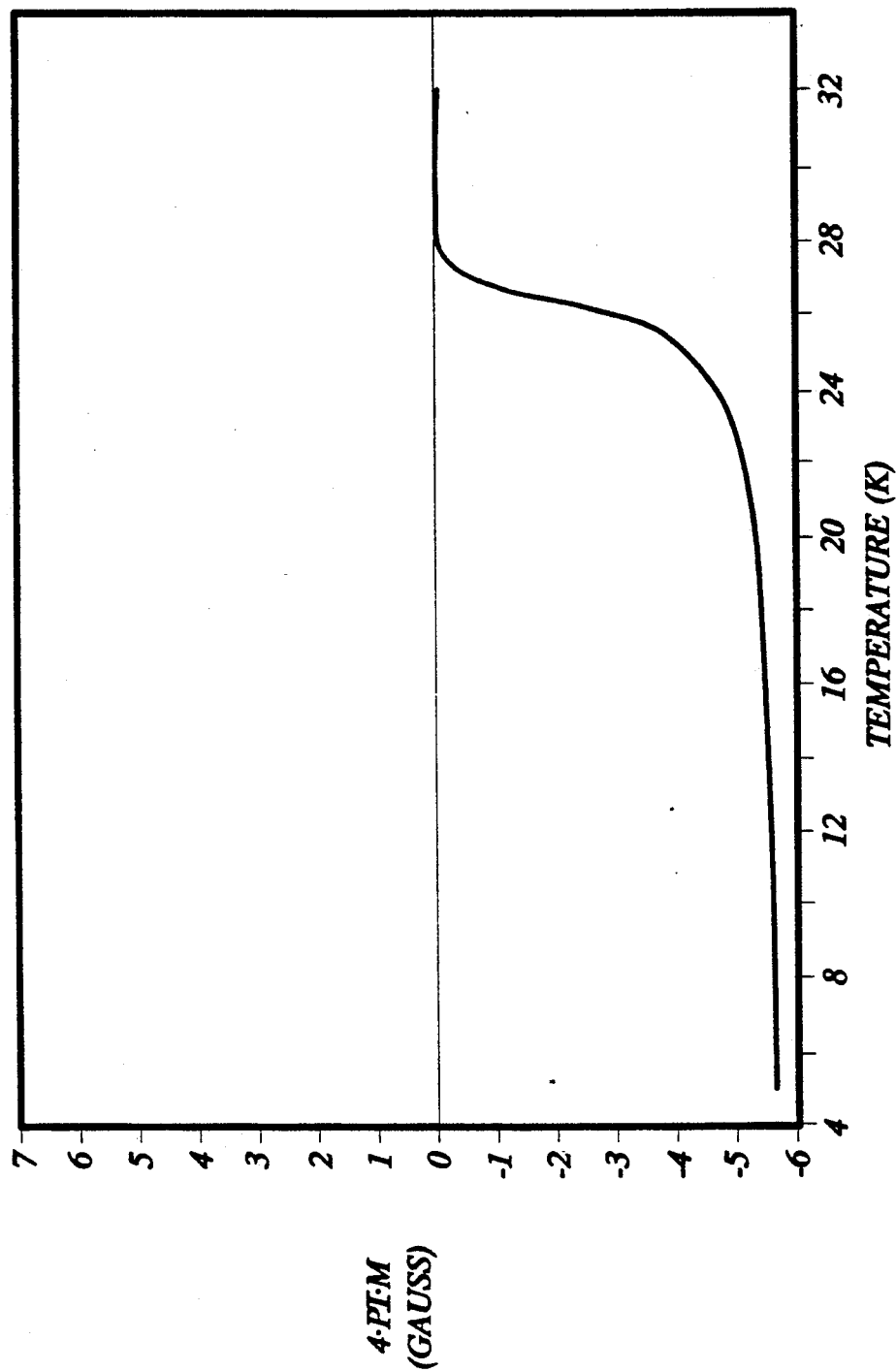
FIG. 23 is a magnetization plot of the cubic $Ba_{0.66}Rb_{0.34}BiO_3$ crystals harvested from cluster sample as determined by superconducting quantum interference device.

In spite of the large variety of stoichiometries encountered in the Ba-Rb-Bi-O system, one may still expect the longer deposition time experiments to generate the high $T_c$ Ba-Rb-Bi-O crystals as was observed in the Ba-K-Bi-O system. A 7 day non-interrupted MSAE experiment was performed with the same flux composition as quoted above. The Ba-Rb-Bi-O cluster evolved from the dendritic growth pattern to a stable growth pattern generating crystals with cubic morphology, as shown in FIG. 22. EDX analysis of the cubic crystals show the average composition approximates $Ba_{0.66}Rb_{0.34}BiO_3$. This stoichiometry corresponds to the high Tc superconducting phase. The SQUID measurement in FIG. 23 shows the 28K $T_c$ onset with a 6K transition width. The cubic morphology observed can be contrasted with the results from the 3 days/2 days/2 days three step experiment. This result provides clear evidence that the substrate effect does play an important role in determining the crystal growth mechanism.

Figure 24:
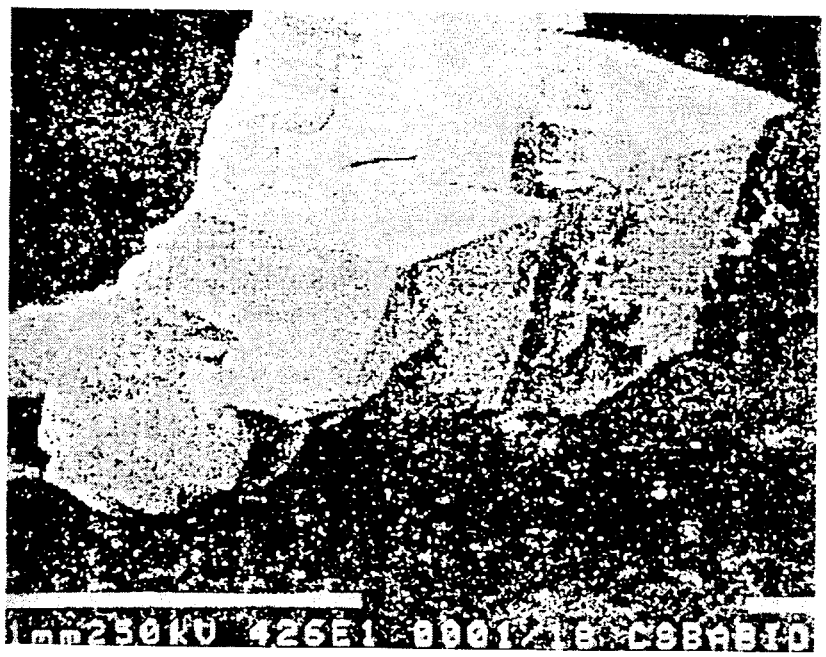
FIG. 24 is an SEM micrograph of cubic $Ba_{1-x}Cs_xBiO_3$ crystallites grown from a CsOH molten flux system.
Figure 25:
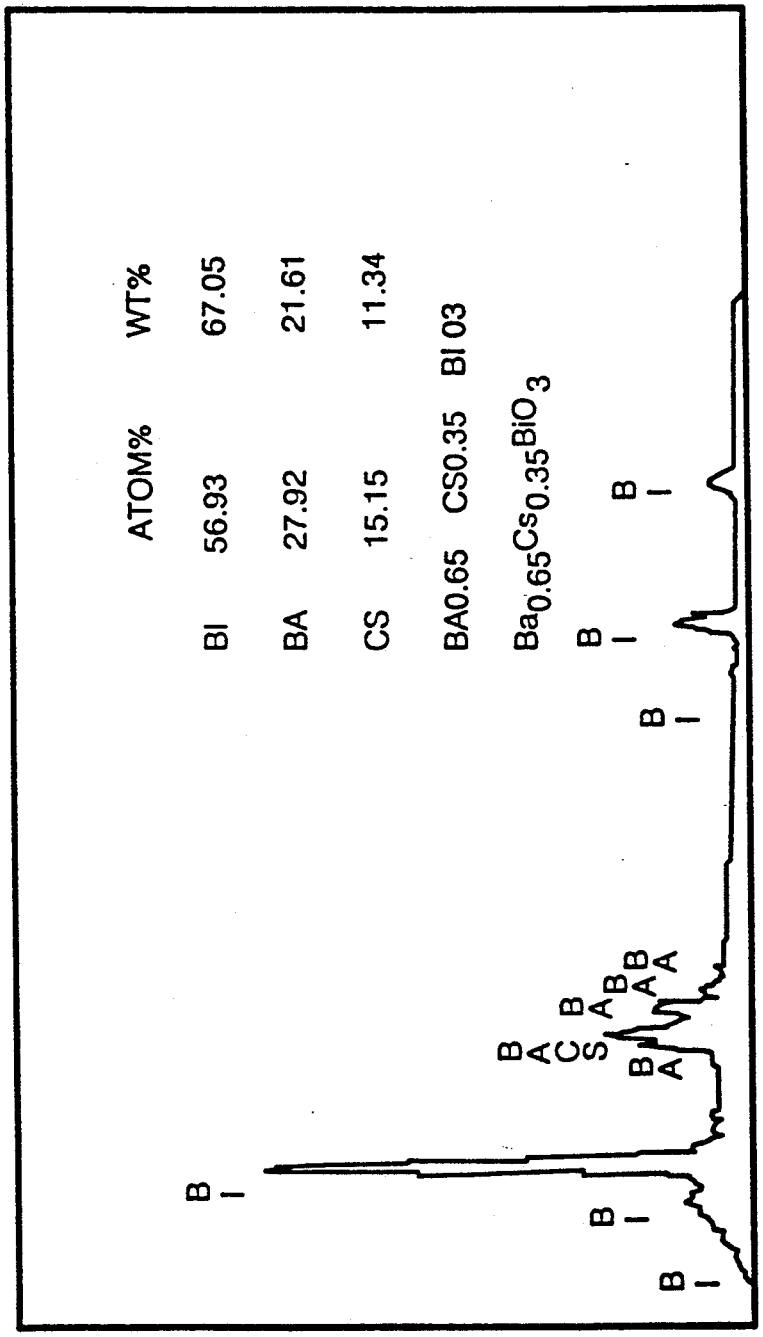
FIG. 25 is an energy dispersive X-ray spectrum of the cubic $Ba_{0.65}Cs_{0.35}BiO_3$ crystallites.
Figure 26:
FIG. 26 is an SEM micrograph of crystals grown from a Ba(50%)-Sr(50%)-K-Bi-O molten flux.
Figure 27:
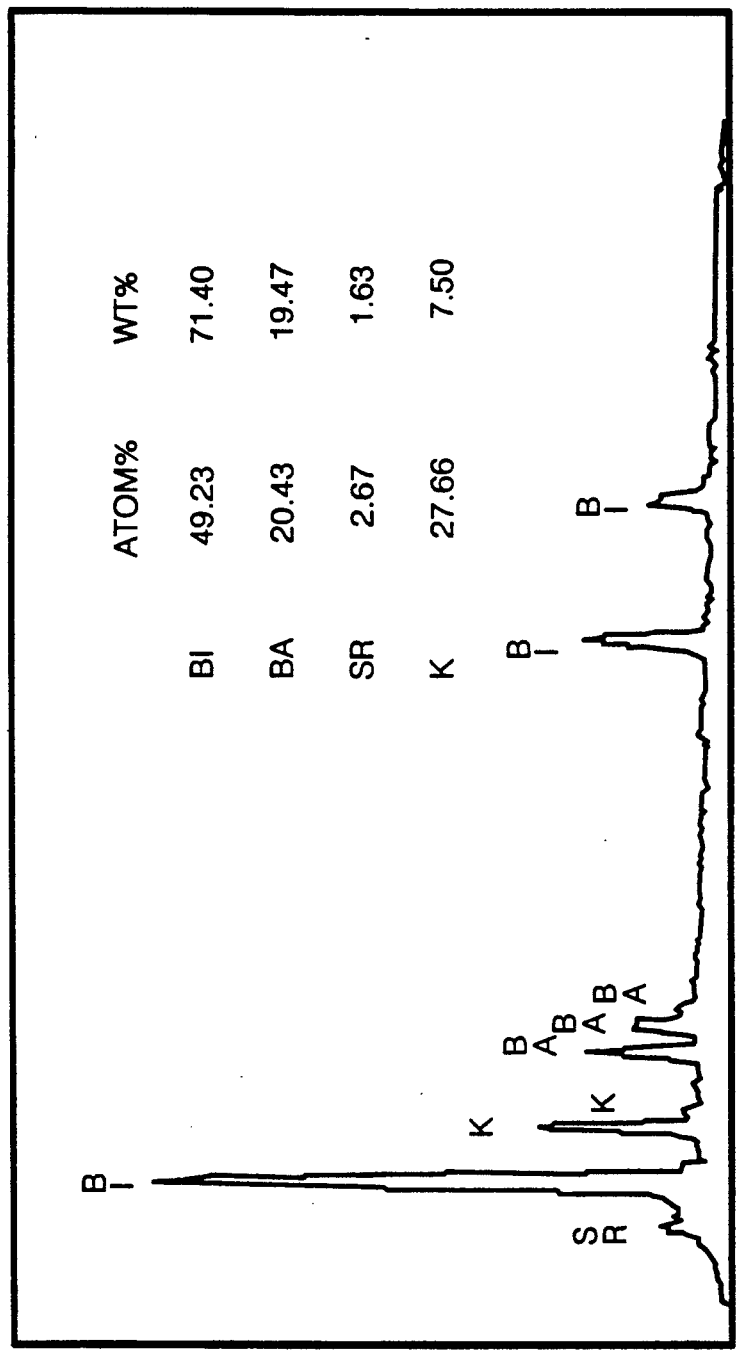
FIG. 27 is an EDX spectrum of the crystals grown from the Ba(50%)-Sr(50%)-K-Bi-O molten flux.
Figure 28:
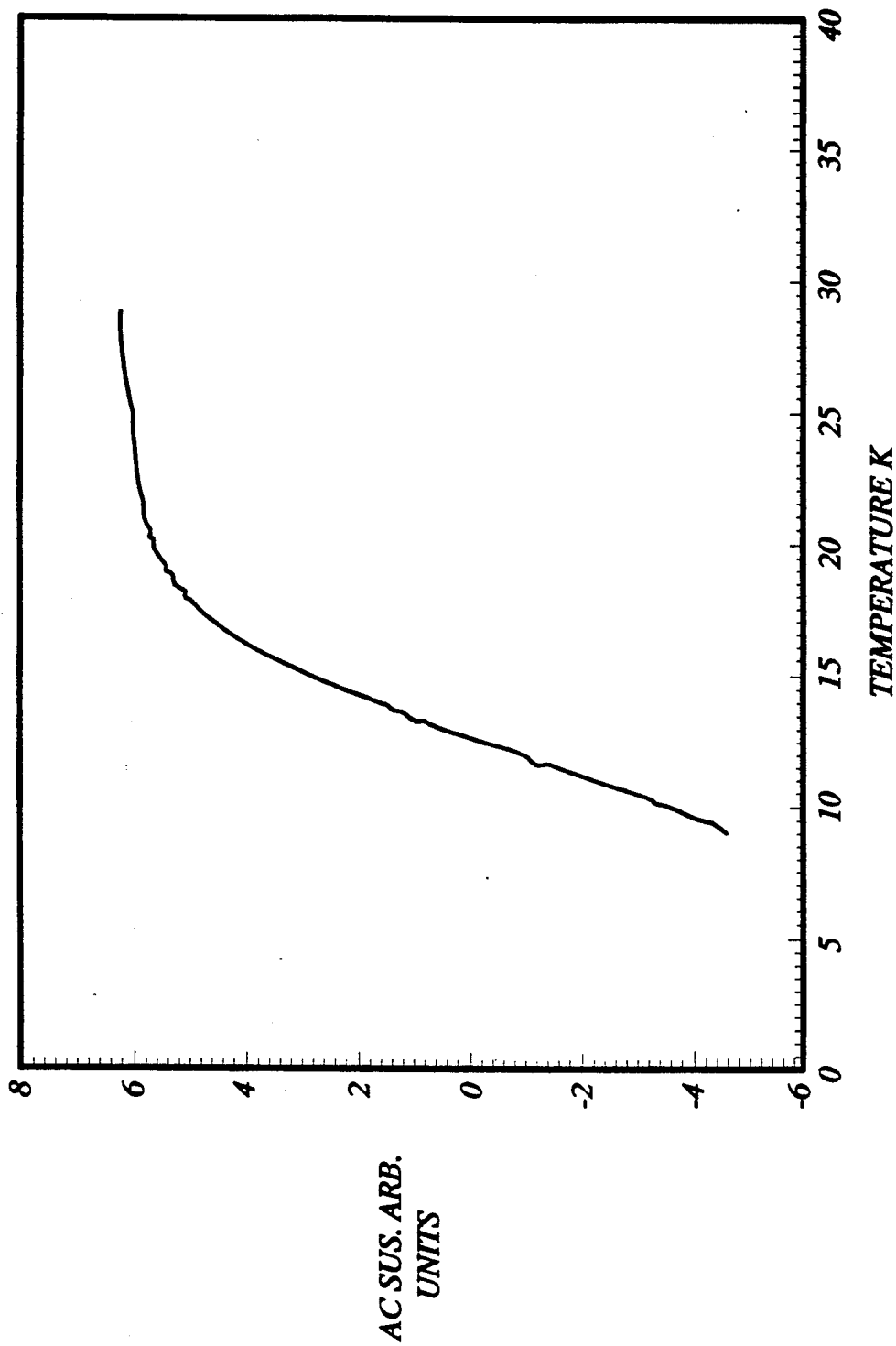
FIG. 28 is a susceptibility plot for the $Ba_{1-x-y}Sr_6K_xBiO_3$ crystallites as determined by a.c. magnetic susceptibility.

MSAE also was used to successfully grow crystalline $Ba_{1-x}Cs_xBiO_3$ materials by replacing the KOH molten flux with CSOH. Although the crystals obtained displayed a cubic morphology and nearly ideal stoichiometry $Ba_{0.68}Cs_{0.32}BiO_3$, as shown in FIGS. 24 and 25, the crystals do not show superconductivity at 4K. In comparison with the Rb system, the disappearance of superconductivity upon Cs substitution can be considered to be due to a size effect in the $ABO_3$ perovskite structure. The large ionic radius may expand the perovskite unit cell quenching metallic conductivity. Other stoichiometries may be superconducting.

b. Isoelectronic substitution for Ba:

Partial substitution of Sr for Ba was performed by replacing $Ba(OH)_2.8H_2O$ With 50 mole % $Sr(OH)_2$ and 50 mole % $Ba(OH)_2.8H_2O$. The SEM/EDX results show unusual morphological and alkali metal solubility properties similar to the previous results observed upon partial Rb substitution in the Ba-K-Bi-O system. In FIG. 26, at least two kinds of crystals, cubic and sandwich-like were observed. The crystals have a wide distribution of compositions, ranging from inhomogeneities from $Sr_{0.212}Ba_{0.446}K_{0.342}BiO_3$ (cubic) to the unusual $Sr_{0.053}Ba_{0.403}K_{0.544}BiO_3$ (sandwich-like), as shown in FIG. 27. The AC magnetic susceptibility shows a $T_c$ onset at 18K which is 14K lower than that observed for Ba-K-Bi-O crystals, as shown in FIG. 28. Partial replacement of K with Rb and Ba with Sr are found to change the crystal structure and solubility limits significantly. In contrast to the pure Ba-K-Bi-O and Ba-Rb-Bi-O systems, which obey the 50% alkaline metal solubility limit and retain the cubic perovskite structure. Small amounts of Sr or Rb substitutions effect large changes in these aspects of the materials. A detailed consideration of the madelung energy, covalency, metallicity and size effects will be required to understand this complex effect. Further studies on the structural distortion and solubility limit questions through a series of partial substitution experiments may provide important information for pursuing liquid nitrogen temperature superconductors by MSAE. Such superconductors usually contain two alkaline-earth elements in their unit cells, such as the most famous Bi-Sr-Ca-Cu-O and Tl-Ba-Ca-Cu-O systems.

c. Substitution for Bi Site:

The Bi substitution is most relevant to the determination of the superconducting mechanism operative in this system. Replacement of Bi with Sb in a $BaPb_{0.75}Sb_{0.25}O_3$ powder sample has been reported with 3.5K $T_c$. The structure of single crystalline $KBiO_3.xH_2O$ has been determined to be isostructural with $KSbO_3$. Therefore, it is to be expected that $KSbO_3$ crystal formation (polymerization) would occur in a manner similar to that of the $KBiO_3$ system. Thus far, anodic electrocrystallization experiments have not produced $KSbO_3$ single crystals. A series of Ba-K-Sb-O experiments similar to those employed in the Ba-K-Bi-O system were performed at temperatures ranging from 200° C. to 260° C. and for periods of 1 day for each crystal growth experiment. No crystallization on the electrode surface has been observed. The $Sb_2O_3$ in the molten flux may be readily oxidized electrochemically to the +5 state and have a high solubility. Antimony and antimony trioxide are much more toxic than bismuth materials, therefore, experiments performed in the current molten flux cell design were limited. It should be noted that all of the substitution experiments were performed in a relative short time except for those in Ba-Rb-Bi-O system. The transition temperatures determined from these materials may not represent the best or optimum properties for each system, and further studies may be able to raise their transition temperatures.

d4. Conclusion:

The high $T_c$ $Ba_{1-x}Rb_xBiO_3$ crystalline materials have been successfully prepared by the MSAE method. Based on the results from $Ba_{1-x}K_xBiO_3$, $KBiO_3.xH_2O$ and $Ba_{1-x}Rb_xBiO_3$ systems, a conclusion can be drawn that the structure of the substrate surface, the flux composition, the flux temperature and the applied potential all have a strong impact on the products obtained. In order to obtain the best quality single crystalline materials, the four factors mentioned above need to be controlled precisely.

Partial replacement with Sr or Rb in the BKBO system brings about new structural and solubility limit problems. Substitution of Sb for Bi yields results which appear to contradict the prediction from BCS theory that when lighter elements are substituted into the lattice, $T_c$ should rise. In this research, a partial model for the crystallization mechanism of $KBiO_3.xH_2O$ has been developed. This $KBiO_3$ system becomes much more complex when one attempts to introduce Ba into its unit cell. Thus far, it is still difficult to find a relationship between the electrocrystallization mechanisms operative in the $KBiO_3$ and Ba-K-Bi-O systems. It would appear to be necessary to use two different polymerization models.

The above detailed description is of the best mode of the invention contemplated by the inventors at this time. The Examples given are for illustrative purpose only and it is contemplated that many variations may be made in the mode here chosen and the Examples given without departing from the scope of the appended claims.

What is claimed is:

1. A method for the electrochemical deposition of bismuth based materials and superconductors using molten salt electrocrystalization, comprising the steps of:
    (a) providing a melt solution comprising a barium-based component and a bismuth-based component;
    (b) maintaining said melt solution at a temperature which is sufficient to sustain said melt solution in a molten state and is below about 400° C.
    (c) providing an anode and a cathode and a bismuth reference electrode and suspending said anode, said cathode and said electrode within said melt solution; and
    (d) electrodepositing a bismuth based material onto said anode while maintaining a substantially constant potential at the anode with reference to the bismuth reference electrode.

2. The method as claimed in claim 1, wherein said electrodeposition occurs under isothermal conditions.

3. The method as claimed in claim 2, wherein said electrodeposition takes place at a temperature of between about 50° C. and 400° C.

4. The method as claimed in claim 3, wherein said electrodeposition occurs at a temperature between about 50° C. and 240° C.

5. The method as claimed in claim 2, wherein said melt solution comprises potassium hydroxide, barium hydroxide, and bismuth oxide.

6. The method as claimed in claim 1, wherein said electrodeposition is maintained under an inert atmosphere.

7. The method as claimed in claim 1, wherein said constant potential is between about 0.6 and 0.9 volts versus the bismuth reference electrode.

8. The method as claimed in claim 2, wherein said melt solution comprises barium hydroxide, rubidium hydroxide, and bismuth oxide.

9. The method as claimed in claim 5, wherein said melt solution further comprises rubidium hydroxide.

10. The method as claimed in claim 5, wherein said hydroxide, said barium-based component and said bismuth-based component are provided in a weight ratio of approximately 5.0:0.4:0.6.

11. The method as claimed in claim 3, wherein said electrochemical deposition is based on the potential and composition of said melt solution.

12. The method as claimed in claim 11, wherein said bismuth based material electrodeposited in step (d) is a superconductor material.

* * * * *